(12) United States Patent
Pan et al.

(10) Patent No.: US 12,471,316 B2
(45) Date of Patent: Nov. 11, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Kuan-Ting Pan, Taipei (TW); Kuo-Cheng Chiang, Hsinchu County (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 647 days.

(21) Appl. No.: 17/897,201

(22) Filed: Aug. 28, 2022

(65) Prior Publication Data

US 2024/0072147 A1 Feb. 29, 2024

(51) Int. Cl.
| | | |
|---|---|---|
| *H10D 30/67* | (2025.01) | |
| *H01L 21/762* | (2006.01) | |
| *H10D 62/10* | (2025.01) | |
| *H10D 64/01* | (2025.01) | |
| *H10D 64/23* | (2025.01) | |
| *H10D 64/68* | (2025.01) | |

(52) U.S. Cl.
CPC ... *H10D 30/6735* (2025.01); *H01L 21/76224* (2013.01); *H10D 30/6757* (2025.01); *H10D 62/121* (2025.01); *H10D 64/017* (2025.01); *H10D 64/258* (2025.01); *H10D 64/693* (2025.01)

(58) Field of Classification Search
CPC .......... H10D 30/6735; H10D 30/6757; H10D 62/121; H10D 64/017; H10D 64/258; H10D 64/693; H01L 21/76224
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Jeff W Natalini
*Assistant Examiner* — Rose Keagy
(74) *Attorney, Agent, or Firm* — JCIPRNET

(57) ABSTRACT

A semiconductor device includes a substrate, a shallow trench isolation structure, two epitaxial structures, one or more semiconductor channel layers, a gate metal layer and a gate spacer. The shallow trench isolation structure is disposed over the substrate. The epitaxial structures are disposed over the shallow trench isolation structure. The one or more semiconductor channel layers connect the two epitaxial structures. The gate metal layer is located between the epitaxial structures and engages the one or more semiconductor channel layers. The gate spacer is in contact with a sidewall of the gate metal layer. From a cross-section view, a neck portion of the gate metal layer adjacent to and along the one or more semiconductor channel layers, and one side of the neck portion is retracted by a distance relative to the gate spacer, and the distance is greater than 0 and less than or equal to 2 nanometers.

20 Claims, 26 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2018/0151739 A1* | 5/2018 | Liang ................. H10D 30/6212 |
| 2019/0165137 A1* | 5/2019 | Chen .................... H10D 84/853 |
| 2020/0006478 A1* | 1/2020 | Hsu ...................... H10D 84/038 |
| 2021/0043727 A1* | 2/2021 | Frougier ................ H10D 30/43 |
| 2021/0343713 A1* | 11/2021 | Ju ...................... H01L 21/28123 |
| 2022/0052174 A1* | 2/2022 | Lo ........................ H10D 64/017 |

* cited by examiner

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-11A and 12-22A are perspective views schematically illustrating various stages of a manufacturing method of a semiconductor device, in accordance with some embodiments.

DETAILED DESCRIPTION

Figure 1:
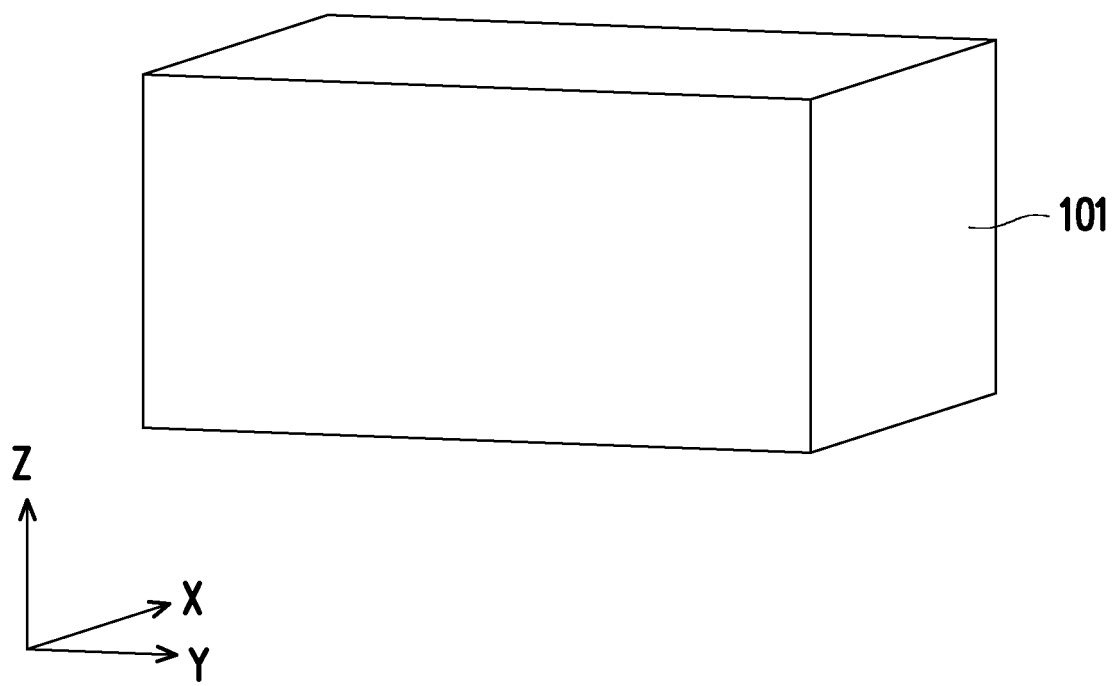

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the disclosure describe a manufacturing process of a semiconductor device (or a portion of a nanostructure transistor device). The nanostructure transistor device (also referred to as a gate-all-around (GAA) transistor device) may include a gate structure wrapping around the perimeter of one or more nanostructures (i.e. channel regions) for improved control of channel current flow. In some embodiments, the semiconductor device is formed on bulk silicon substrates. Still, the semiconductor device may be formed on a silicon-on-insulator (SOI) substrate, a germanium-on-insulator (GOI) substrate, a silicon germanium substrate, or a Group III-V semiconductor substrate. Also, in accordance with some embodiments, the silicon substrate may include other conductive layers or other semiconductor elements, such as transistors, diodes or the like. The embodiments are not limited in this context. The semiconductor device may be included in microprocessors, memories, and/or other integrated circuits (IC). Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of the semiconductor device, it is understood the semiconductor device may be part of an IC that further includes a number of other devices such as resistors, capacitors, inductors, fuses, etc.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments are described below in a particular context, namely, a die comprising nanostructure field-effect transistors (nano-FETs). Various embodiments may be applied, however, to dies comprising other types of transistors (e.g., fin field effect transistors (FinFETs), planar transistors, or the like) in lieu of or in combination with the nano-FETs.

FIGS. 1-11A and 12-22A are perspective views schematically illustrating various stages of a manufacturing method of a semiconductor device, in accordance with some embodiments. FIG. 11B is another perspective views schematically illustrating various stages of the manufacturing method of the semiconductor device, where FIG. 11B corresponds to FIG. 11A, in accordance with some embodiments. FIG. 22B is another perspective views schematically illustrating various stages of the manufacturing method of the semiconductor device, where FIG. 22B corresponds to FIG. 22A, in accordance with some embodiments. FIG. 22C is cross-sectional views of the semiconductor device along line I-I of FIG. 22B, where FIG. 22C corresponds to FIGS. 22B, in accordance with some embodiments. For clarity of illustrations, in the drawings are illustrated the orthogonal axes (X, Y and Z) of the Cartesian coordinate system according to which the views are oriented.

Referring to FIG. 1, a substrate 101 is provided. The substrate 101 may be a semiconductor substrate, such as a bulk semiconductor, a semiconductor-on-insulator (SOI) substrate, or the like, which may be doped (e.g., with a p-type or an n-type dopant) or undoped. In some embodiments, the semiconductor substrate 101 is made of a suitable elemental semiconductor (e.g., germanium), a suitable compound semiconductor (e.g., gallium arsenide, silicon carbide, indium arsenide, or indium phosphide), a suitable alloy semiconductor (e.g., silicon germanium carbide, gallium arsenic phosphide, or gallium indium phosphide), and/or the like. In some embodiments, the semiconductor substrate 101 includes a SOI substrate. The semiconductor substrate 101 may include various doped regions (not individually shown) doped with p-type or n-type dopants, where the doped regions may be configured for an n-type FET, or alternatively, configured for a p-type FET.

Figure 2:
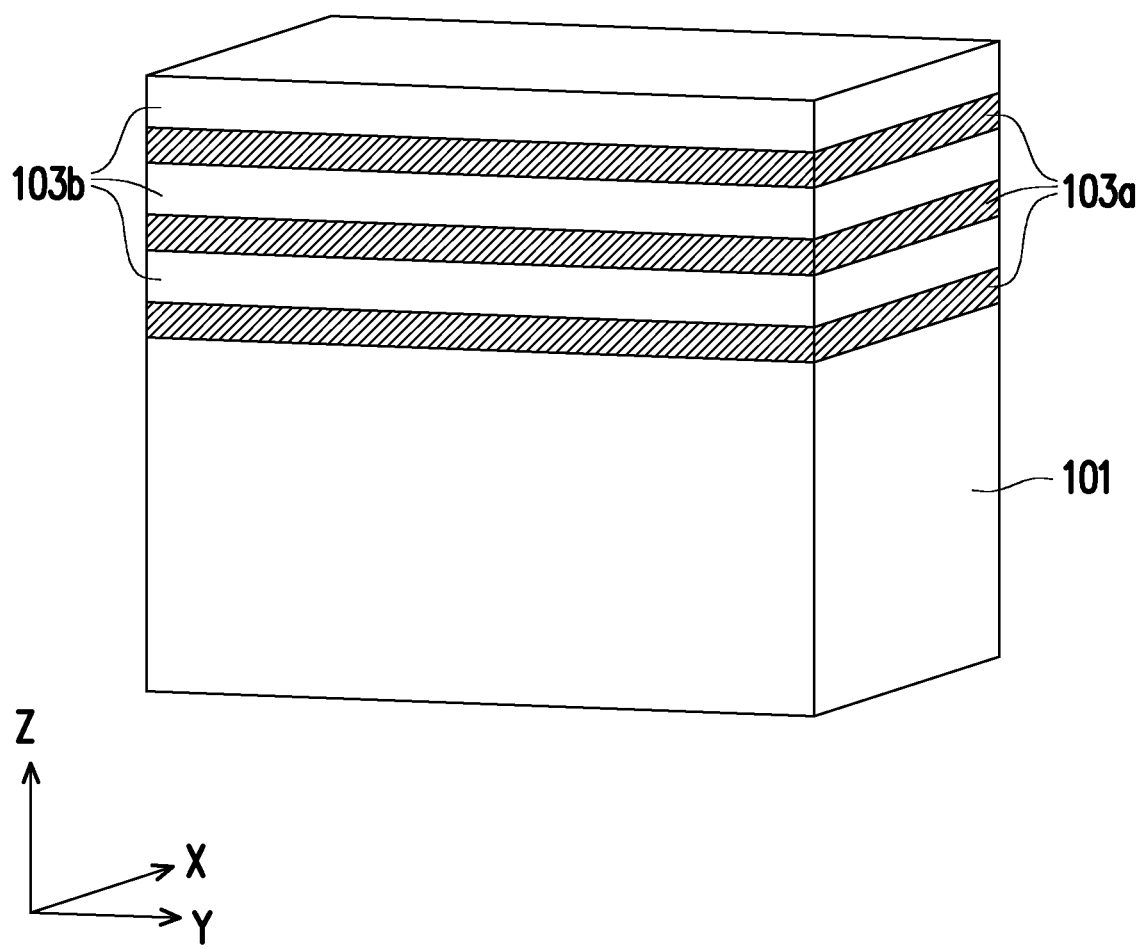

Referring to FIG. 2, a stack of first semiconductor layers 103a and second semiconductor layers 103b may be formed on the substrate 101. The first semiconductor layers 103a and the second semiconductor layers 103b may be alternately stacked upon one another (e.g., along the Z direction) to form a stack. The first semiconductor layers 103a may be considered sacrificial layers in the sense that they are removed in the subsequent process. In some embodiments, the multi-layer stack may include any number of the first semiconductor layers 103a and the second semiconductor layers 103b. Each of the layers of the multi-layer stack may be epitaxially grown using a process such as chemical vapor deposition (CVD), atomic layer deposition (ALD), vapor phase epitaxy (VPE), molecular beam epitaxy (MBE), or the like. In some embodiments, the bottommost one of the first semiconductor layers 103a is formed on the substrate 101, with the remaining second semiconductor layers 103b and first semiconductor layers 103a alternately stacked on top. However, either the first semiconductor layer 103a or the second semiconductor layer 103b may be the bottommost layer (or the layer most proximate from the substrate 101), and either the first semiconductor layer 103a or the second semiconductor layer 103b may be the topmost layer (or the layer most distanced to the substrate 101). The disclosure is not limited by the number of stacked semiconductor layers.

The first semiconductor layers 103a and the second semiconductor layers 103b may have different materials (or compositions) that may provide for different oxidation rates and/or different etch selectivity between the layers. For example, the second semiconductor layers 103b are formed of the same material as the substrate 101, while the first semiconductor layers 103a may be formed of a different material which may be selectively removed with respect to the material of the substrate 101 and the second semiconductor layers 103a. In some embodiments, the material of the first semiconductor layers 103a includes silicon germanium (SiGe). In some embodiments, the second semiconductor layers 103b include silicon (Si), where each of the second semiconductor layers 103b may be undoped or substantially dopant-free. The second semiconductor layers 103b may be considered as semiconductor channel layers. However, the disclosure is not limited thereto, and other suitable material, or other combinations of materials for which selective etching is possible are contemplated within the scope of the disclosure.

Figure 3:
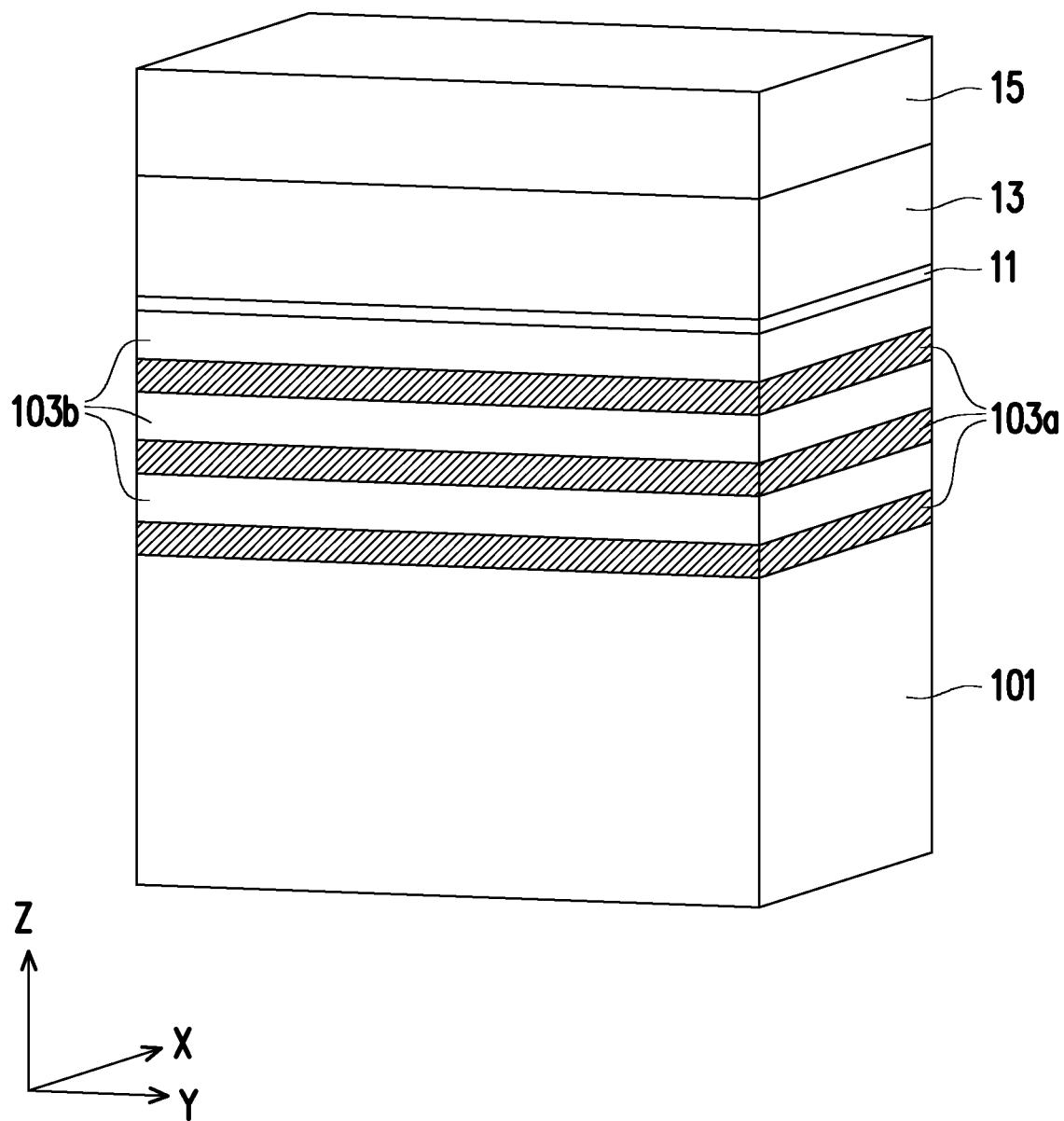

Referring to FIG. 3, layers of mask material are formed over the topmost one of the second semiconductor layers 103b. In some embodiments, the mask layer may be a single layer. In the present embodiment where the mask layer includes sublayers 11, 13 and 15, each of the sublayers 11, 13 and 15 is formed of a semiconductor material similar to the material of first semiconductor layer 103a and the second semiconductor layer 103b or is formed of different dielectric materials. For example, the sublayer 11 and the sublayer 15 may include a suitable material such as oxide, and the sublayer 13 may include a suitable material such as nitride, but is not limited to.

Figure 4:
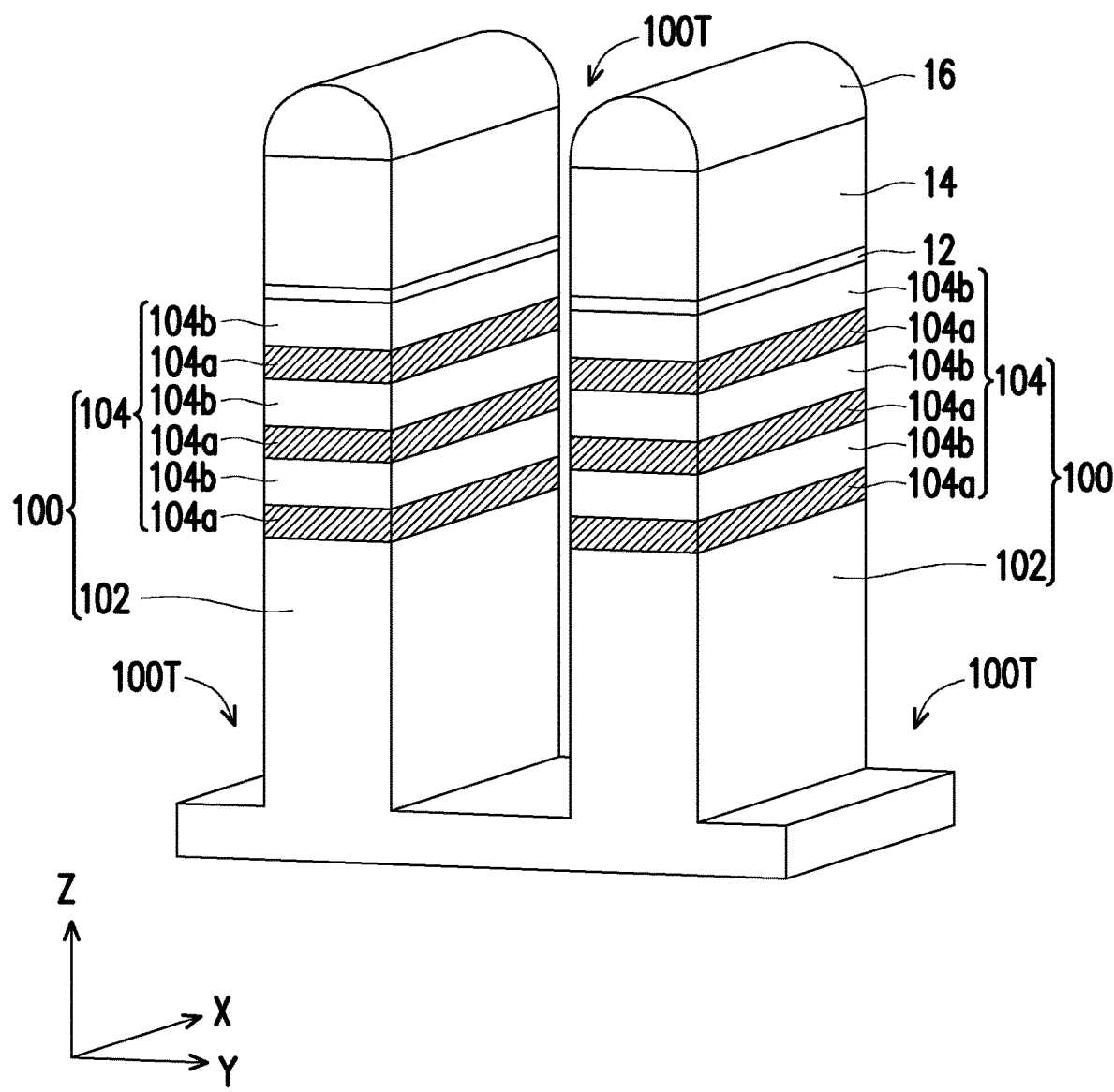

Referring to FIG. 4 and with reference to FIG. 3, a portion of the stack of first semiconductor layers 103a and second semiconductor layers 103b and a portion of the substrate 101 may be removed to form trenches 100T, thereby defining fin structures 100 between adjacent trenches 100T. The trenches 100T may continuously extend along the X-direction, and the trenches 100T may be disposed between any adjacent ones of the fin structures 100. The fin structures 100 may be formed by patterning the stack of first semiconductor layers 103a and the second semiconductor layers 103b and the substrate 101 using, e.g., lithography and etching techniques. The mask layers may be patterned using, e.g., lithography techniques to form patterned mask sublayers 12, 14, and 16 (also referred to as a hard mask). The patterned mask sublayers 12, 14, and 16 may have an elongated size along the X-direction with respect to the Y-direction. The patterned mask sublayers 12, 14 and 16 may be subsequently used to pattern exposed portions of the stack of first semiconductor layer 103a and the second semiconductor layers 103b and the substrate 101 to form the stack of first semiconductor layer 104a and the second semiconductor layers 104b and the substrate 102. The first semiconductor layers 104a and the second semiconductor layers 104b define two nanostructures 104. The nanostructure 104 is, for example, nanosheets, nanowires, or the like. The fin structure 100 including the substrate 102 and the nanostructure 104 may be formed by etching trenches in the stack of first semiconductor layers 103a and the second semiconductor layers 103b and the substrate 101. The etching may be any acceptable etch process, such as a reactive ion etching (RIE), neutral beam etching (NBE), the like, or a combination thereof. The etching may be anisotropic. In some embodiments, the trenches 100T may be parallel strips (when viewed from the top) elongated along the X-direction and distributed along the Y-direction.

Figure 5:
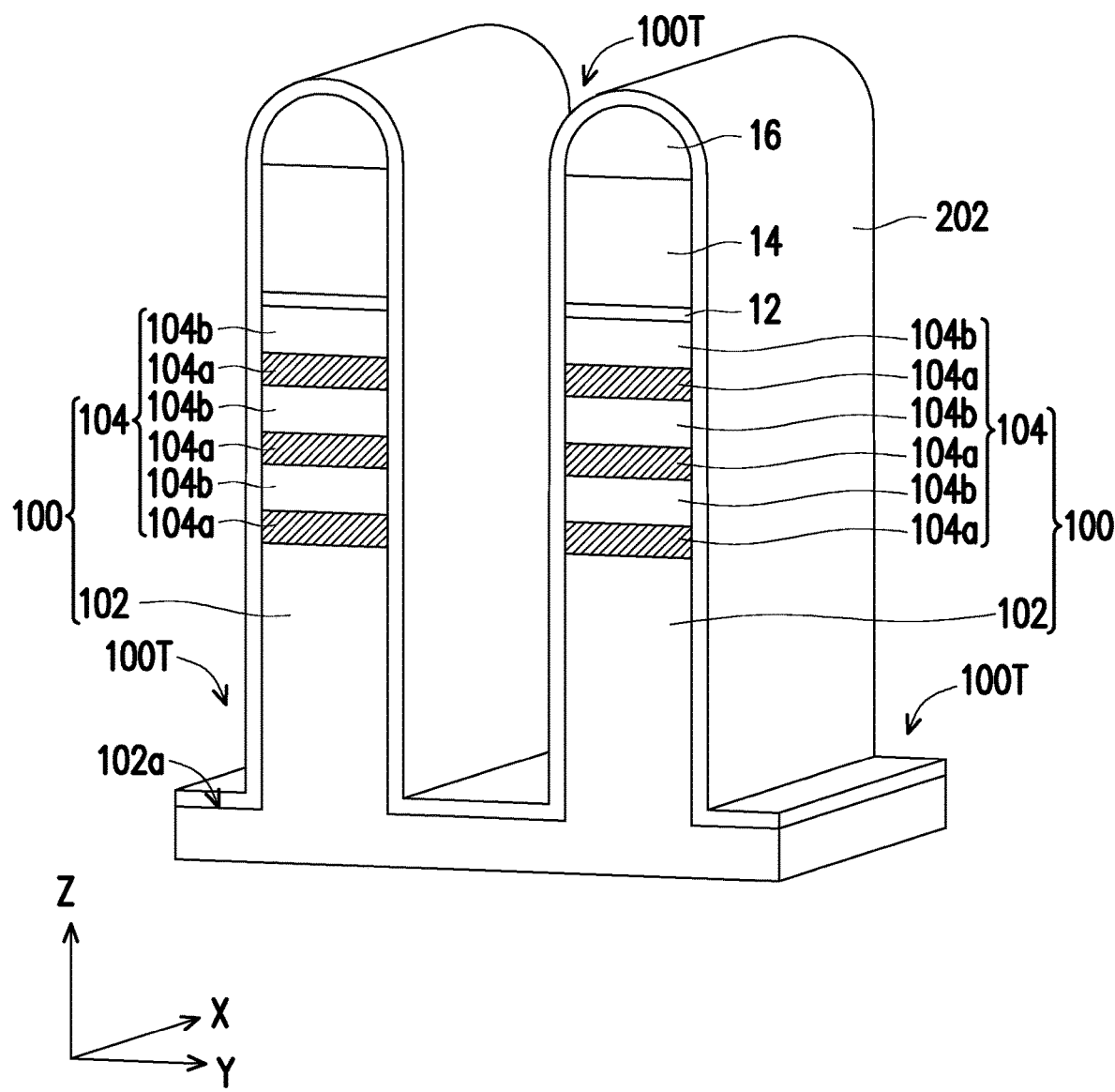

Referring to FIG. 5, a liner 202 may be formed along surfaces of the fin structure 100 and the patterned mask sublayers 12, 14, and 16. The patterned mask sublayers 12, 14, and 16 are still remained on the top second semiconductor layer 104b, and the liner 202 is conformally formed to cover a surface 102a of the substrate 102, surfaces of the nanostructures 104 and the surface of the patterned mask sublayers 12, 14, and 16. The liner 202 may include silicon, but is not limited to, which can avoid the oxidation of the fin structure 100 in the subsequent process.

Figure 6:
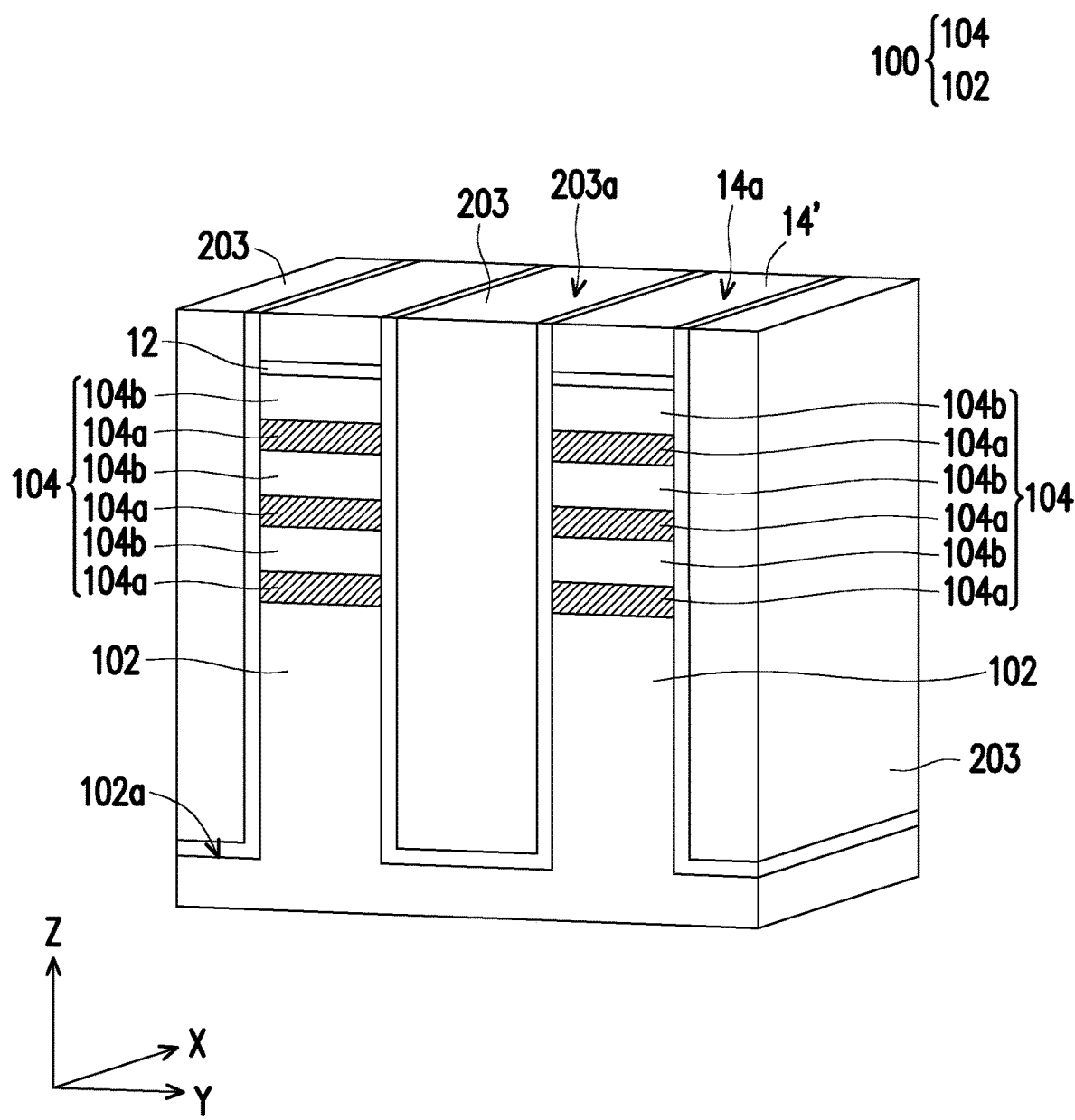

Referring to FIG. 6 and with reference to FIG. 5, a plurality of isolation structures 203 may be formed in the trenches 100T. The isolation structures 203 may be formed by depositing an insulation material on the liner 202. The insulation material may be an oxide, a Si-based oxide (e.g., SiOC, SiOCN, or the like), a nitride, the like, any other suitable material, or combinations thereof) which may electrically isolate neighboring fin structures 100 from each other, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. A removal process is then applied to the insulation material to remove excess insulation material over the fin structure 100. In some embodiments, the insulation material is formed such that excess insulation material covers the nanostructures 104. Although the insulation material is illustrated as a single layer, some embodiments may utilize multiple layers.

A removal process is then applied to the insulation material to remove excess insulation material over the nanostructures 104. In some embodiments, a planarization process such as a chemical mechanical polish (CMP), an etch-back process, combinations thereof, or the like may be utilized. The planarization process exposes a surface 14a of the patterned mask sublayer 14' and surfaces 203a of the isolation structures 203, such that top surfaces of the patterned mask sublayer 14' and the isolation structures 203 are level after the planarization process is complete.

Figure 7:
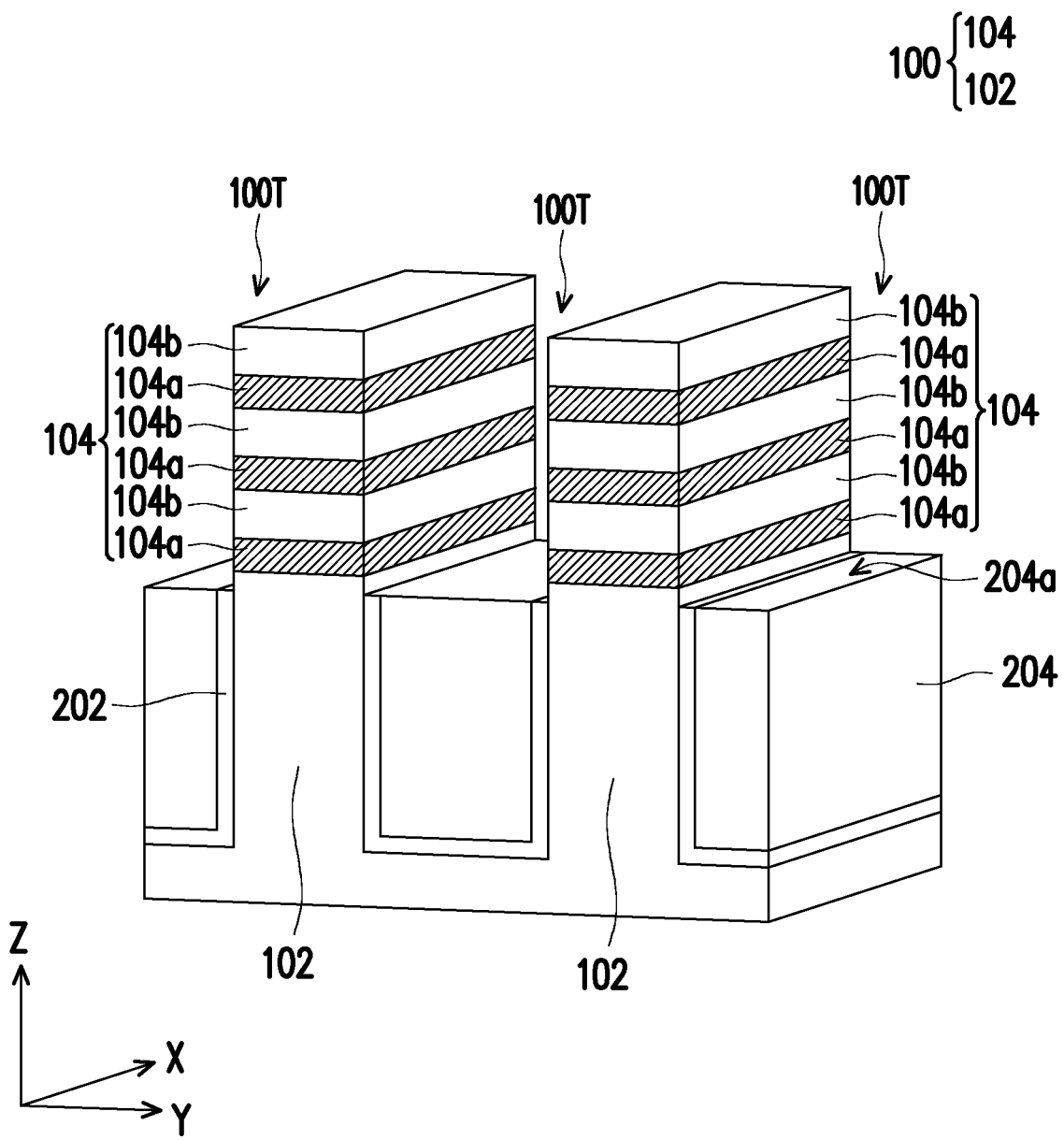

Referring to FIG. 7 and with reference to FIG. 6, a portion of the liner 202 and the patterned mask sublayers 12 and 14' are removed, and the isolation structures 203 is then recessed to form a plurality of shallow trench isolation structures 204 in lower portions of the trenches 100T. Each of the shallow trench isolation structures 204 is disposed between adjacent ones of the fin structures 100 and covers the liner 202 on the respective sidewalls of a lower portion of the respective fin structure 100. That is, the liner 202 is located between the substrate 102 and the shallow trench isolation structures 204, and the substrate 102 is not in direct contact with the shallow trench isolation structures 204. In some embodiments, the shallow trench isolation structures 204 are formed by initially depositing a layer of insulation material in the respective trench 100T and recessing the layer of insulation material using an acceptable etching process, such as one that is selective to the material of the shallow trench isolation structures 204. For example, a dry etching process is performed to form the shallow trench isolation structures 204 having a relatively smooth top surfaces 204a. The top surfaces 204a of the shallow trench isolation structures 204 may be a flat surface, a curved (e.g., convex or concave) surface, or combinations thereof, depending on the etching process.

Figure 8:
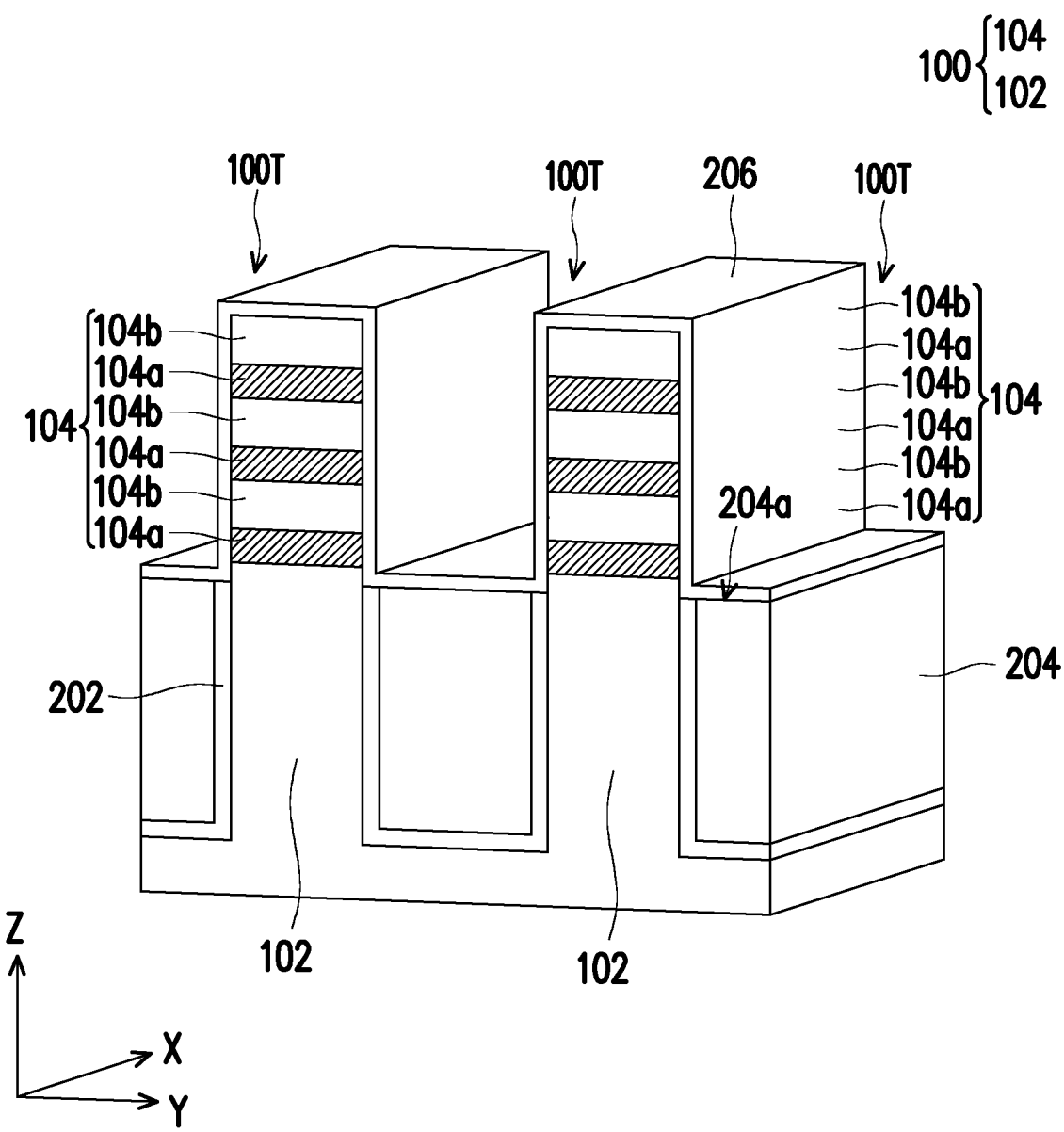

Referring to FIG. 8, a dummy dielectric layer 206 is conformally formed to cover the surfaces of the nanostructures 104 and extend to cover the top surfaces 204a of the shallow trench isolation structures 204. That is, the fin structures 100 is covered by the liner 202 and the dummy dielectric layer 206. The dummy dielectric layer 206 may be, for example, silicon oxide, silicon nitride, a combination thereof, or the like. The dummy dielectric layer 206 may be deposited or thermally grown according to acceptable techniques.

Figure 9:
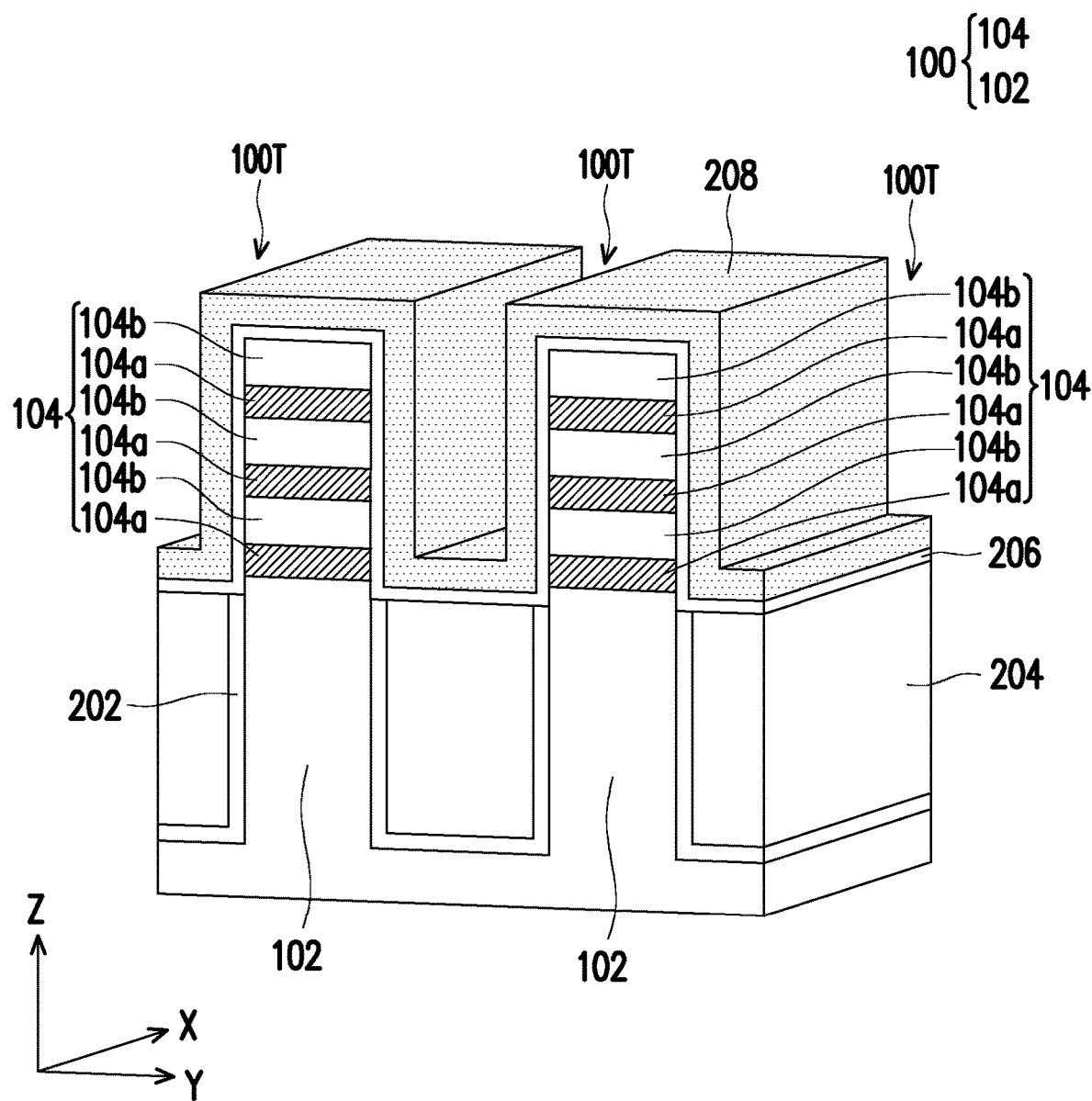

Referring to FIG. 9, a cladding layer 208 is conformally formed on the dummy dielectric layer 206. In some embodiments, the cladding layer 208 includes the same material as the first semiconductor layers 104a (e.g., SiGe or the like). In some embodiments, the cladding layer 208 may be in situ deposit at dummy dielectric layer 206 deposit with Ge dopant or others. Viewed from the Y-direction, the thickness of the cladding layer may be greater than the thickness of the dummy dielectric layer 206.

Figure 10:
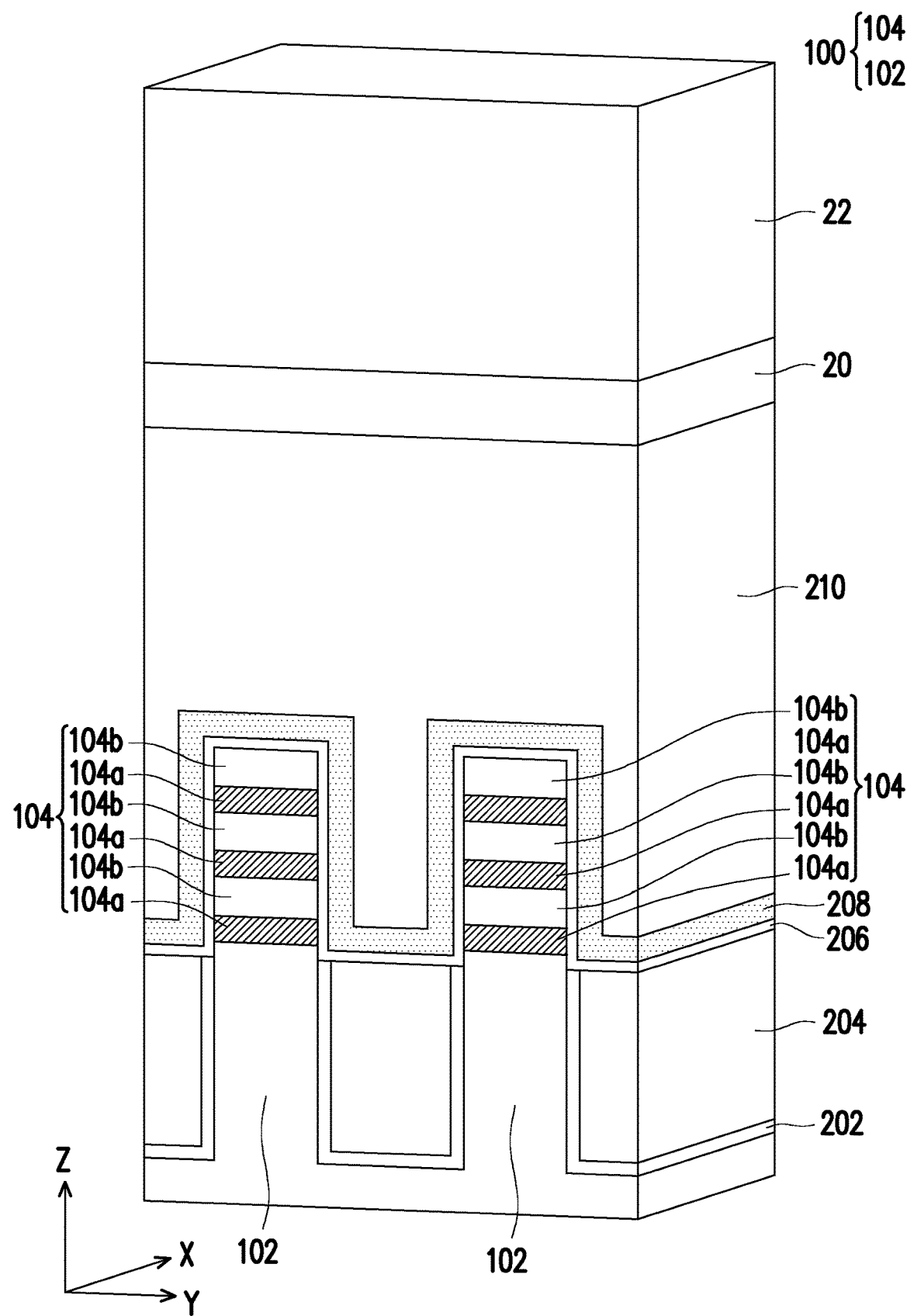

Referring to FIG. 10, a dummy gate layer 210 is formed over the cladding layer 208, and mask layers 20, 22 are formed over the dummy gate layer 210. The dummy gate layer 210 may be deposited over the cladding layer 208 and then planarized, such as by a CMP. The dummy gate layer 210 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 210 may be deposited by physical vapor deposition (PVD), CVD, sputter deposition, or other techniques for depositing the selected material. The dummy gate layer 210 may be made of other materials that have a high etch selectivity from the etching of the shallow trench isolation structures 204. Under the same etching conditions, the etch rate of the cladding layer 208 is higher than an etch rate of the dummy gate layer 210. The mask layers 20, 22 may be deposited over the dummy gate layer 210. The mask layers 20,22 may be formed of, e.g., an oxide, a nitride, a combination thereof, or the like. The respective mask layer may be a single layer or may include more than one sublayer which depends on process requirements. It is noted that the dummy dielectric layer 206 is shown covering only the nanostructures 104 for illustrative purposes only. In some embodiments, the dummy dielectric layer 206 may be deposited such that the dummy dielectric layer 206 covers the shallow trench isolation structures 204. As such, the dummy dielectric layer 206 may extend between the dummy gate layer 210 and the shallow trench isolation structures 204.

Figure 11A:
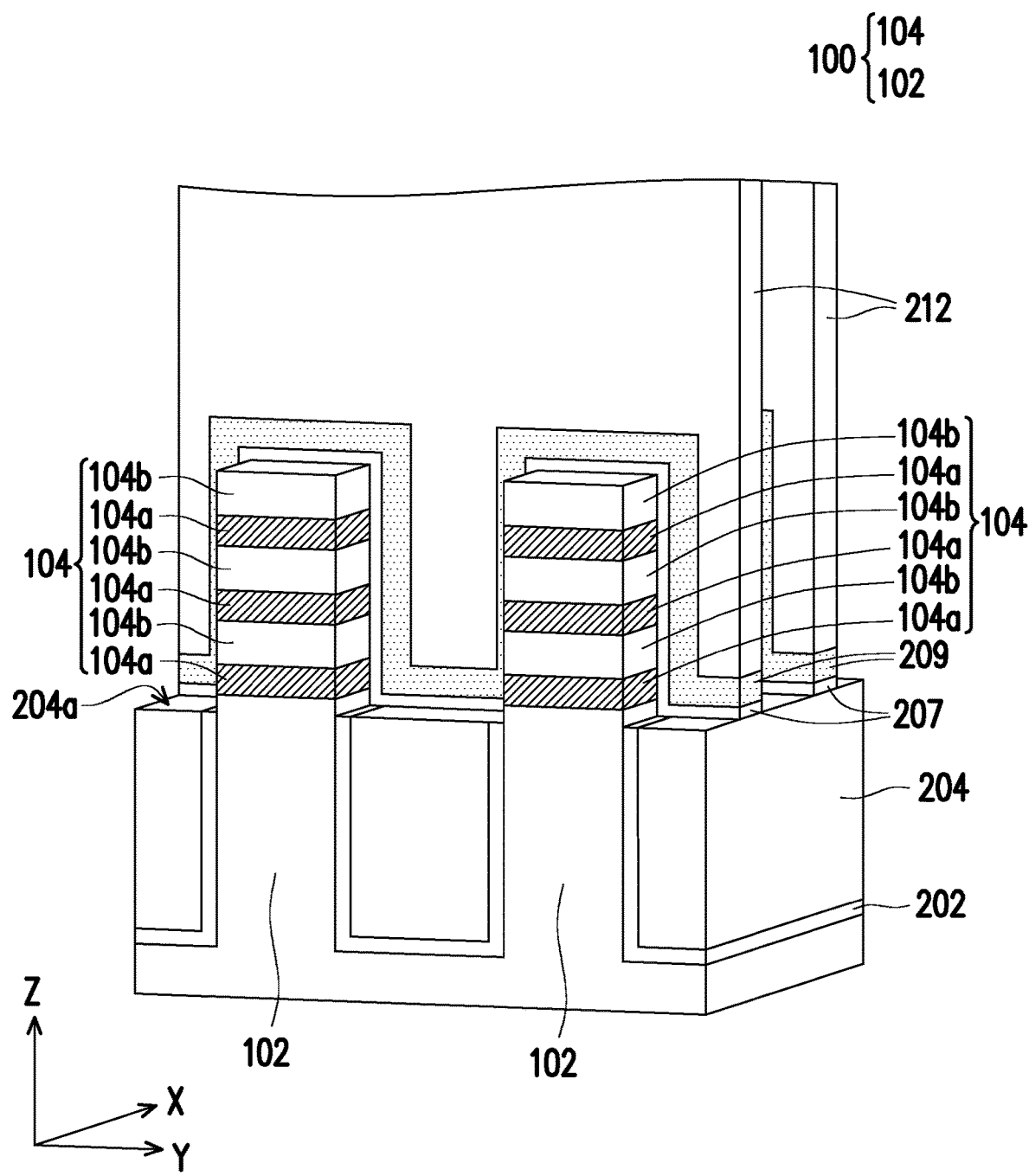
Figure 11B:
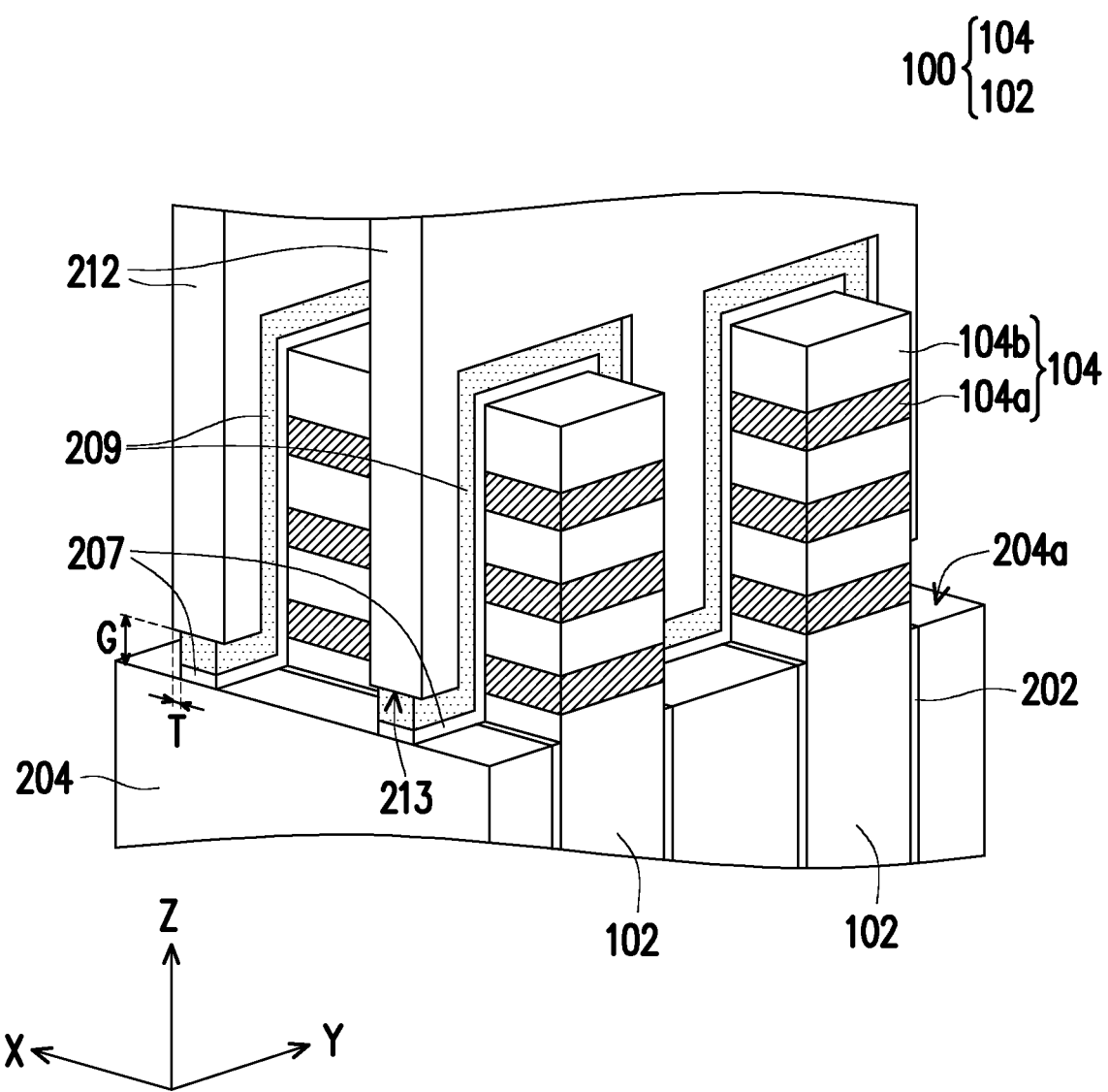
FIG. 11B is another perspective views schematically illustrating various stages of the manufacturing method of the semiconductor device, where FIG. 11B corresponds to FIG. 11A, in accordance with some embodiments.

Referring to FIG. 10, FIG. 11A and FIG. 11B simultaneously, it should be noted that FIG. 11A illustrates a portion in FIG. 10 for clarity of illustration, and thus some layers/structures are not shown in this perspective view. FIG. 11B is another perspective views schematically illustrating various stages of the manufacturing method of the semiconductor device, where FIG. 11B corresponds to FIG. 11A, in accordance with some embodiments. The mask layers 20,22 may be patterned using acceptable photolithography and etching techniques to form masks. The pattern of the masks may be transferred to the dummy gate layer 210, to the cladding layer 208, and to the dummy dielectric layer 206 to form dummy gates 212, cladding layer 209 and dummy gate dielectrics 207, respectively. The dummy gates 212 cover respective channel regions of the nanostructures 104. The pattern of the masks 20,22 may be used to physically separate each of the dummy gates 212 from adjacent dummy gates 212. The dummy gates 212 may have a lengthwise direction perpendicular to the lengthwise direction of respective nanostructures 104. A portion of the dummy gate layer 210, a portion of the cladding layer 208, and a portion of the dummy dielectric layer 206 are removed in one or more etching steps, forming the dummy gates 212, the cladding layer 209 and the dummy gate dielectrics 207, respectively. Since the material of the cladding layer 209 has a different etch rate than the material of dummy gate layer 210, i.e. the etch rate of the cladding layer 209 is higher than the etch rate of the dummy gate layer 210 under the same etching conditions, after the etching process, edges of the cladding layer 209 and edges of the dummy gate layer 207 are retracted by a distance T relative to edges of the dummy gate 212, and there is a gap G between bottom surface 213 of the dummy gate 212 and the top surfaces 204a of the shallow trench isolation structure 204.

Figure 12:
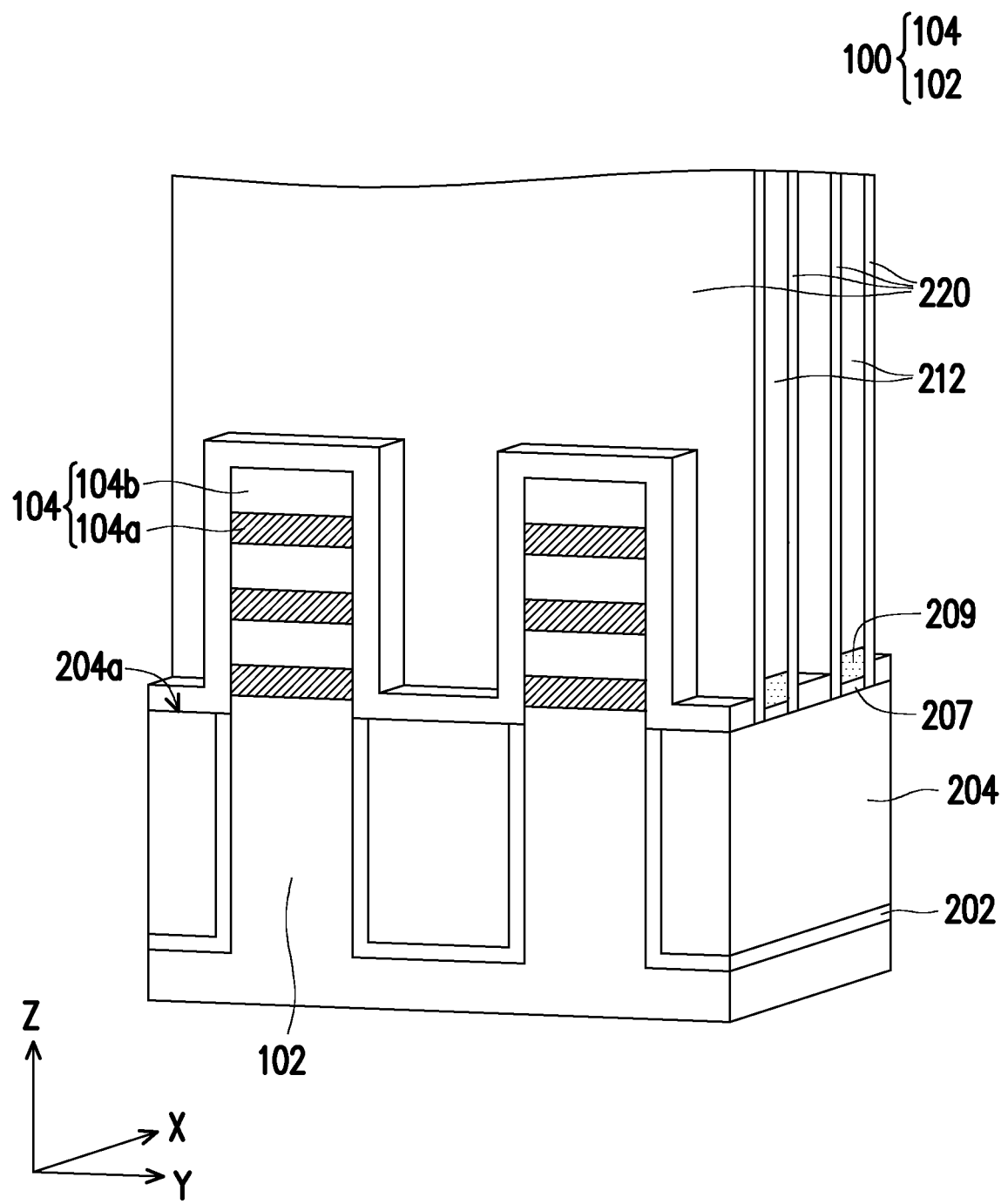

Referring to FIG. 12 and with reference to FIG. 11B, the gate spacer layer 220 is formed on top surfaces 204a of the shallow trench isolation structure 204, top surfaces and sidewalls of the nanostructures 104, the dummy gates 212, the cladding layer 209 and the dummy gate dielectrics 207. The gate spacer layer 220 spatially separates the dummy gate 212 from one another. The gate spacer layer 220 may be low-k spacers having a k-value less than or equal to 7, and may be formed of silicon nitride (SiN), silicon nitricarbide (SiCN), silicon oxycarbonitride (SiOCN), silicon oxycarbide (SiOC), Silicon oxynitride (SiON), or the like, using techniques such as thermal oxidation or deposited by CVD, ALD, or the like.

Figure 13:
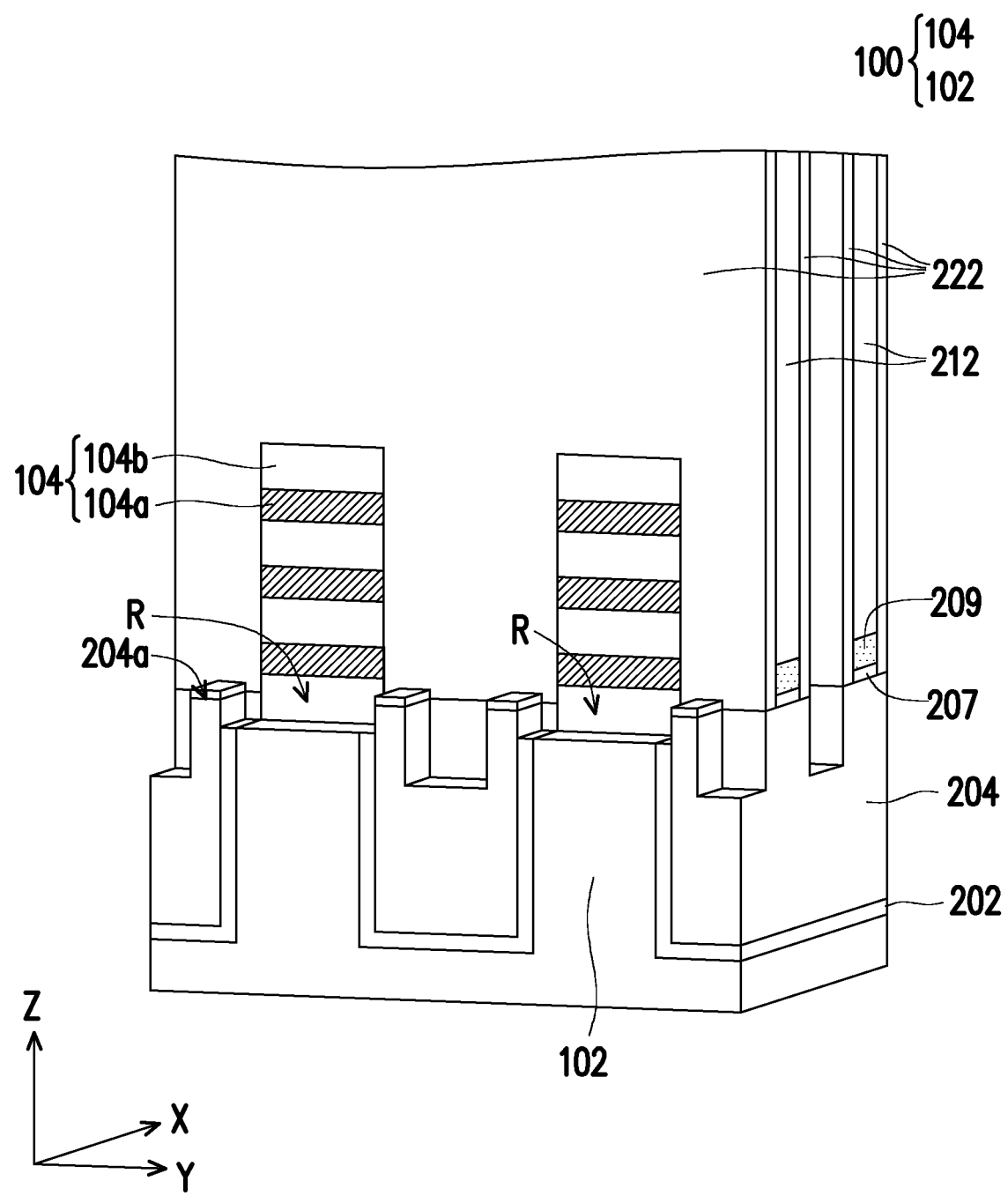

Referring to FIG. 13 and with reference to FIG. 12, a portion of the respective gate spacer layer 220 is removed to form gate spacers 222, and a plurality of source/drain trenches R may be formed in the nanostructures 104 and the substrate 102 along the Z-direction. For example, during the formation of the source/drain trenches R, not only the portions of the gate spacer layer 220, but also portions of the fin structure 100 may be removed. The source/drain trenches R may extend through the nanostructures 104 and into the substrate 102. In some embodiments, the top surfaces 204a of the shallow trench isolation structure 204 may be below the bottom surfaces of the source/drain trenches R. In some embodiments, top surfaces 204a of the shallow trench isolation structure 204 may be level with or above bottom surfaces of the source/drain trenches R. The source/drain trenches R may be formed by using anisotropic etching processes, such as RIE, NBE, or the like. A single etch process or multiple etch processes may be used to etch each layer of nanostructures 104 and the substrate 102. Timed etch processes may be used to stop the etching after the source/drain trenches R reach desired depths.

Figure 14:
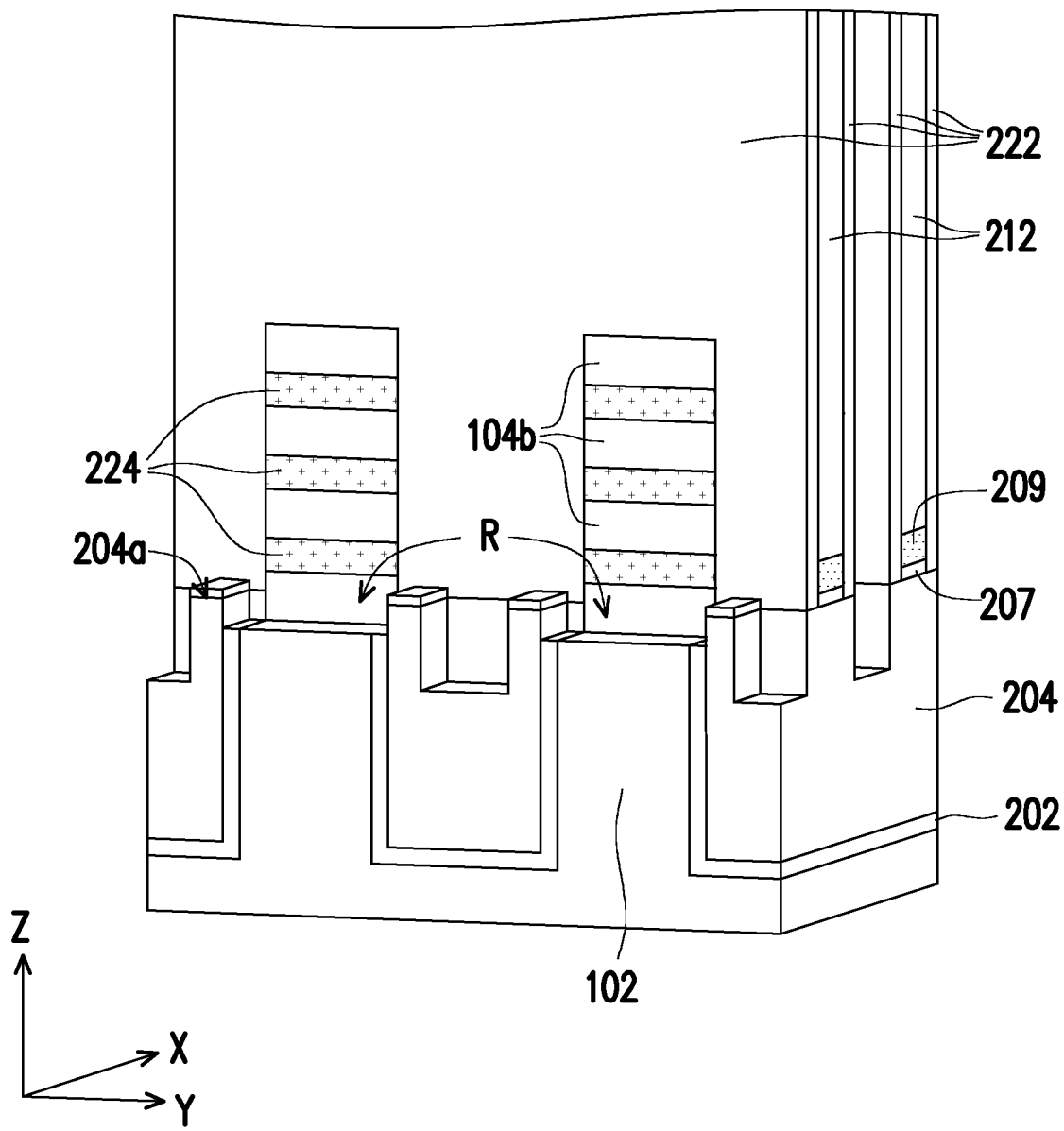

Referring to FIG. 14 and with reference to FIG. 13, portions of sidewalls of the layers of the multi-layer stack formed of the first semiconductor layers 104a exposed by the source/drain trenches R are etched to form sidewall recesses. The sidewalls may be etched using isotropic etching processes, such as wet etching or the like. In an embodiment in which the second semiconductor layers 104b include, e.g., Si or SiC, and the first semiconductor layers 104a include, e.g., SiGe, a wet or dry etch process with hydrogen fluoride, another fluorine-based etchant, or the like may be used to etch sidewalls of the first semiconductor layers 104a. Next, inner spacers 224 are formed in the sidewall recess. The inner spacers 224 may be deposited using, e.g., a conformal deposition process, such as CVD, ALD, or the like, and subsequent etch back to remove excess spacer material on the sidewalls of the fin structure 100 and on a surface of the substrate 102. The gate spacers 222 may serve as etching masks when removing excess spacer material, and thus the outer sidewall of the respective gate spacer 222 may be substantially aligned (or coplanar) with the outer sidewalls of the underlying second semiconductor layers 104b and the inner spacers 224. The inner spacer 224 may comprise a material such as silicon nitride, silicon carbonitride, silicon-carbon-oxynitride, or any other type of dielectric material, although any suitable material, such as low-dielectric constant (low-k) materials, may be utilized. The inner spacers 224 may be formed from the same or different material as the gate spacers 222. The inner spacers 224 act as isolation features between subsequently formed source/drain regions and gate structures.

Figure 15:
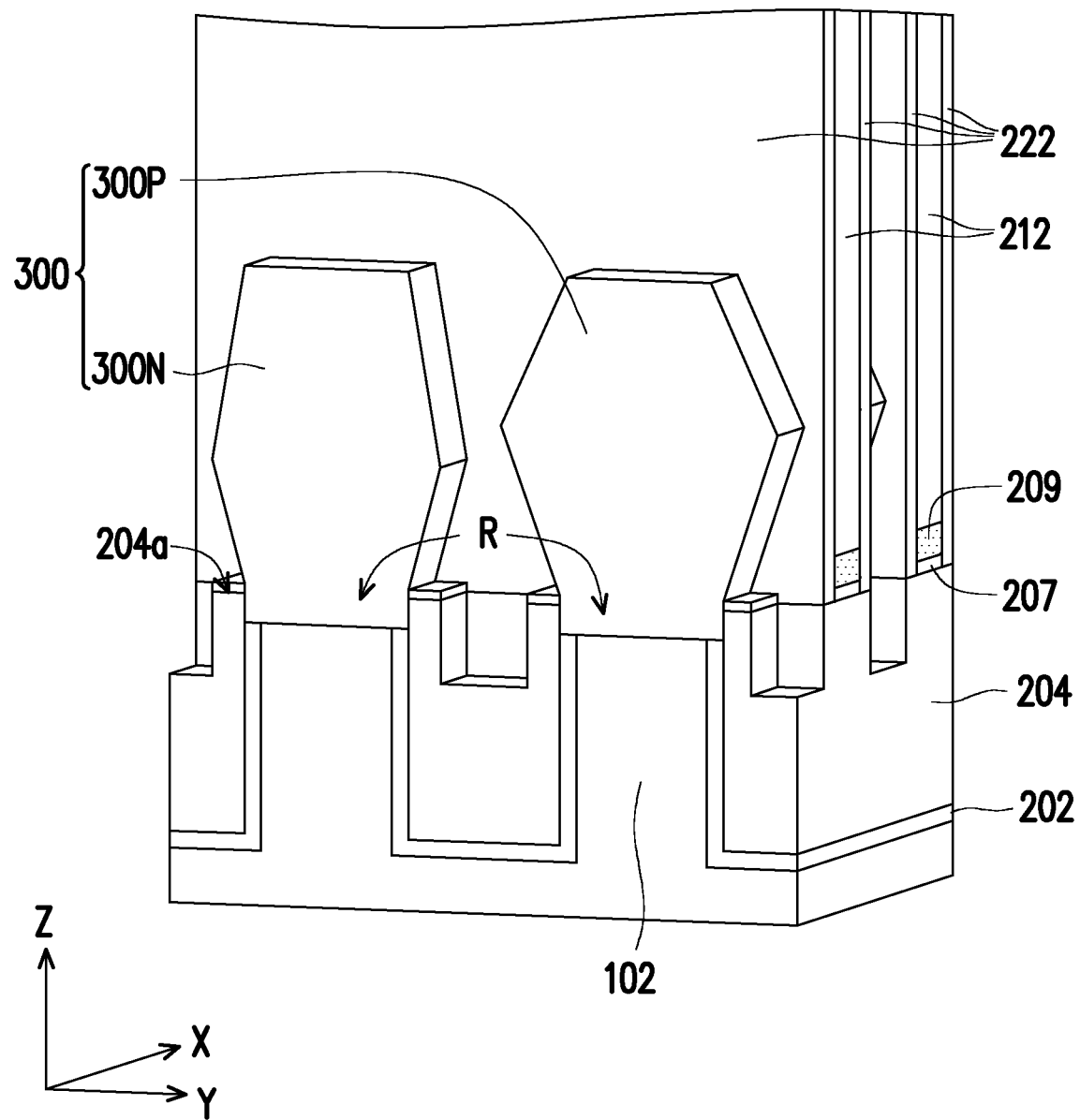

Referring to FIG. 15 and with reference to FIG. 14, epitaxial structures 300 (e.g., 300N and 300P) are formed in the source/drain trenches R. The epitaxial structures 300 may be coupled to the exposed surfaces of the second semiconductor layers 104b of the fin structure 100 and the inner spacers 222. In some embodiments, a bottom surface of the epitaxial structures 300 may be substantially leveled with the top surface 204a of the neighboring shallow trench isolation structure 204. The bottom surface of the epitaxial structures 300 may be lower than the top surface 204a of the neighboring shallow trench isolation structure 204. The epitaxial structures 300 may each include silicon germanium, indium arsenide, indium gallium arsenide, indium antimonide, germanium arsenide, germanium antimonide, indium aluminum phosphide, indium phosphide, any other suitable material, or combinations thereof. The epitaxial structures 300 may be formed using an epitaxial layer growth process on the exposed surfaces of each of the second semiconductor layers 104b and the inner spacers 222. The material of the epitaxial structures 300 may be doped with a conductive dopant. For example, a strained material is epitaxially grown with an n-type dopant (or a p-type dopant) for straining the epitaxial structures 300 in the n-type region (or the p-type region). In some embodiments, the material of the epitaxial structures 300 is disposed as a multi-layered structure, with different layers having different degrees of doping. Alternatively, the material of the epitaxial structures 300 may be disposed as a single-layered structure.

Figure 16A:
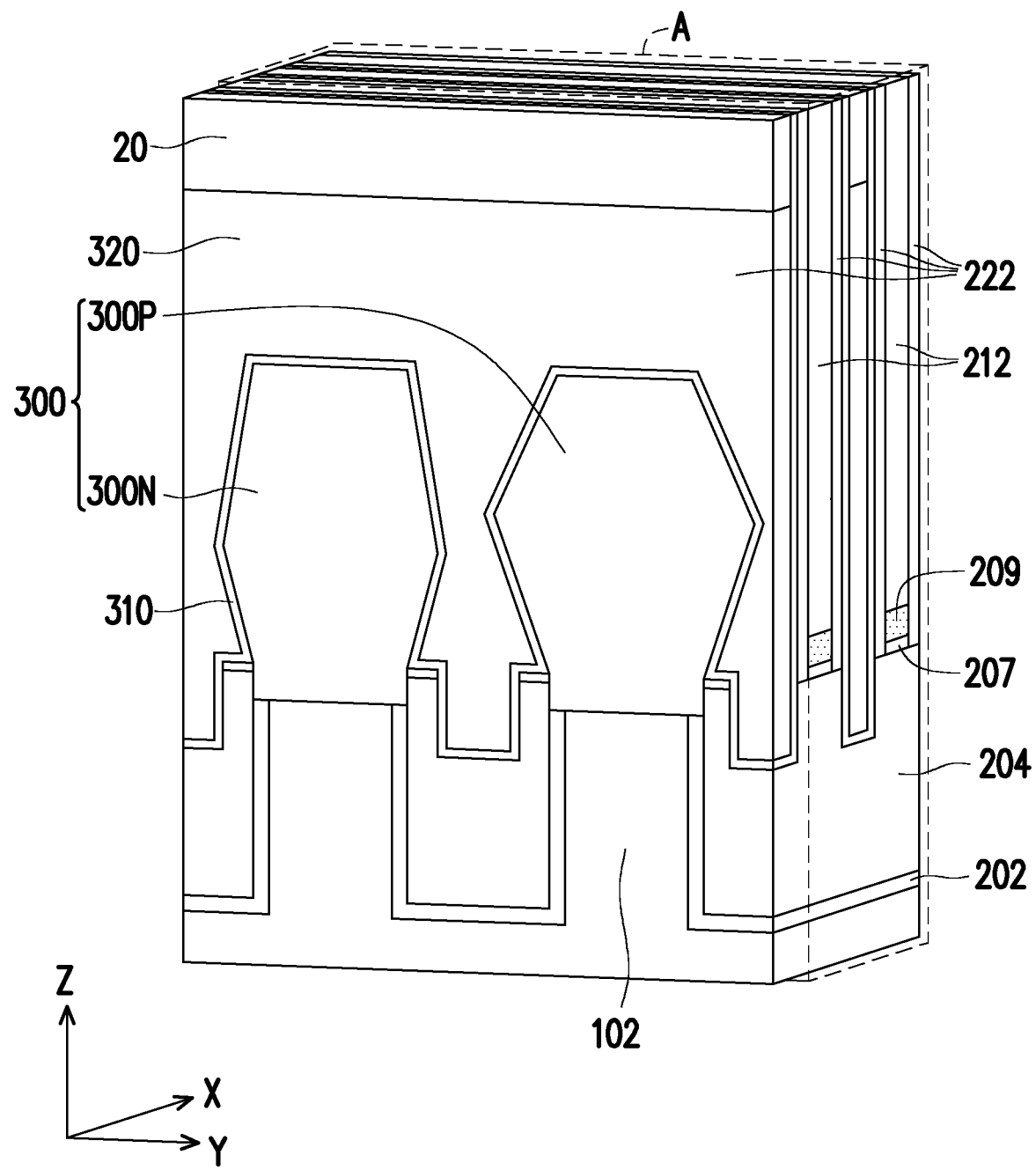

Referring to FIG. 16A and with reference to FIG. 15, interlayer dielectric (ILD) 320 may be formed to overlay the epitaxial structures 300 with a contact etch stop layer 310 disposed therebetween. The contact etch stop layer 310 is disposed between the interlayer dielectric 320 and the epitaxial structures 300. In some embodiments, the contact etch stop layer 310 may be conformally formed over the epitaxial structures 300. The contact etch stop layer 310 may comprise a dielectric material, such as, silicon nitride, silicon oxide, silicon oxynitride, or the like, having a different etch rate than the material of the overlying interlayer dielectric 320. The interlayer dielectric 320 may be formed over the contact etch stop layer 310. The interlayer dielectric 320 may be formed of a dielectric material, and may be deposited by any suitable method, such as CVD, plasma-enhanced CVD (PECVD), or FCVD. Dielectric materials may include oxide, phosphosilicate glass (PSG), borosilicate glass (BSG), boron-doped phosphosilicate glass (BPSG), undoped silicate glass (USG), or the like. Other insulation materials formed by any acceptable process may be used.

Figure 16B:
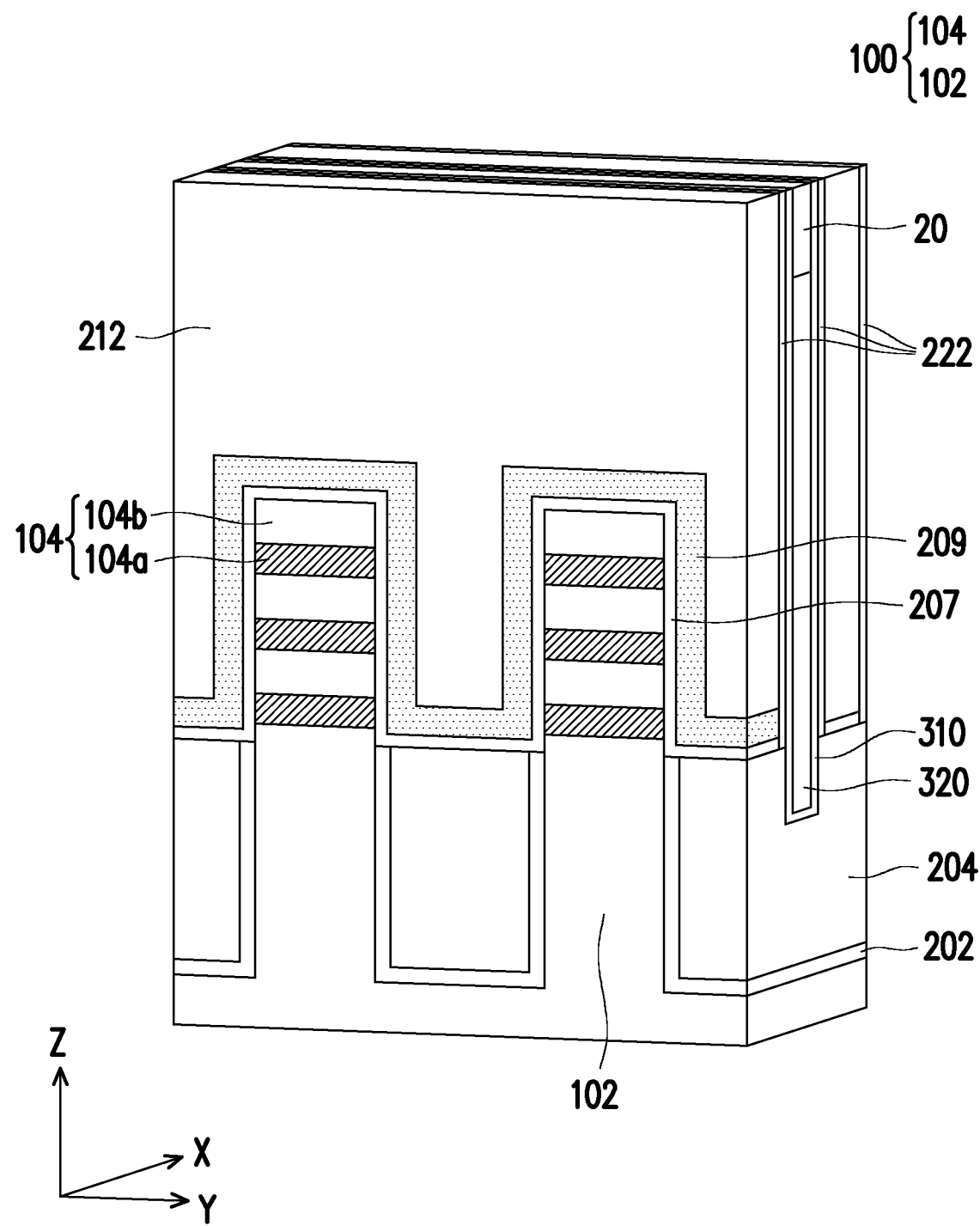

Referring to FIG. 16B and with reference to FIG. 16A, it should be noted that FIG. 16B illustrates only the portion A outlined in FIG. 16A for clarity of illustration, and thus some layers/structures are not shown in this perspective view. A planarization process, such as a CMP, may be performed to level the top surfaces of the interlayer dielectric 320 and the contact etch stop layer 310 with the top surfaces of the dummy gates 212 or the mask layer 20. After the planarization process, top surfaces of the dummy gates 212, the gate spacers 222, the interlayer dielectric 320 and the contact etch stop layer 310 may be level with one another, within process variations. Accordingly, the top surfaces of the dummy gates 212 are exposed through the interlayer dielectric 320. In some embodiments, the mask layer 20 may remain, in which case the planarization process levels top surfaces of the interlayer dielectric 320 with top surfaces of the mask layer 20, the gate spacers 22, and the contact etch stop layer 310.

Figure 17:
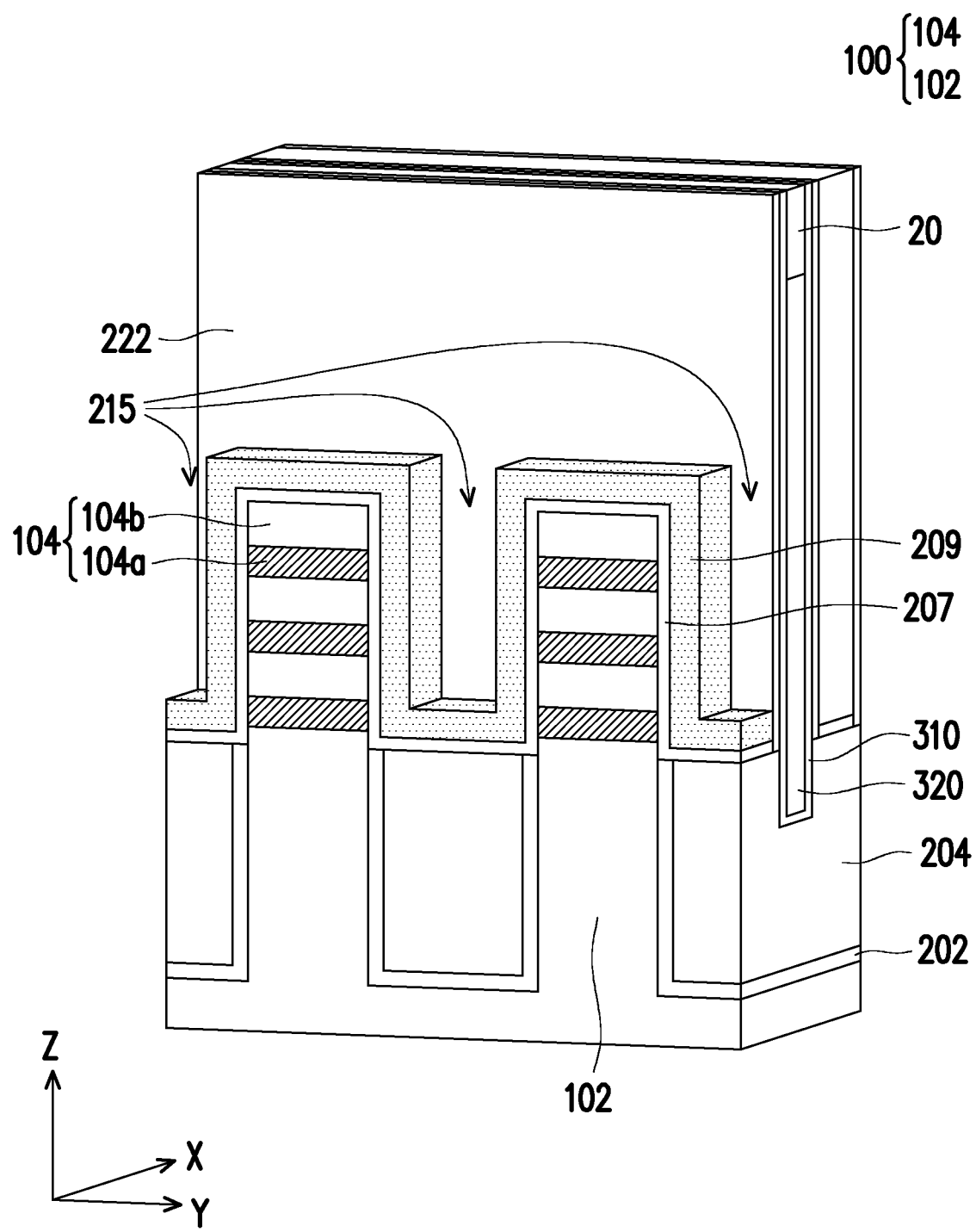

Referring to FIG. 17 and with reference to FIG. 16B, the dummy gates 212 are removed in one or more etching steps, forming recesses 215 and expose the cladding layer 209. In some embodiments, the dummy gates 212 are removed by an anisotropic dry etch process. For example, the etching process may include a dry etch process using reaction gas(es) that selectively etch the dummy gates 212 at a faster rate than the interlayer dielectric 320, the contact etch stop layer 310, or the cladding layer 209. Each of the recesses 215 exposes and/or overlies portions of nanostructures 104, which act as channel regions in subsequently completed nano-FETs. Portions of the nanostructures 104 which act as the channel regions are disposed between neighboring pairs of the epitaxial source/drain regions 300. During the removal, the cladding layer 209 may be used as etch stop layers when the dummy gates 212 are etched.

Figure 18:
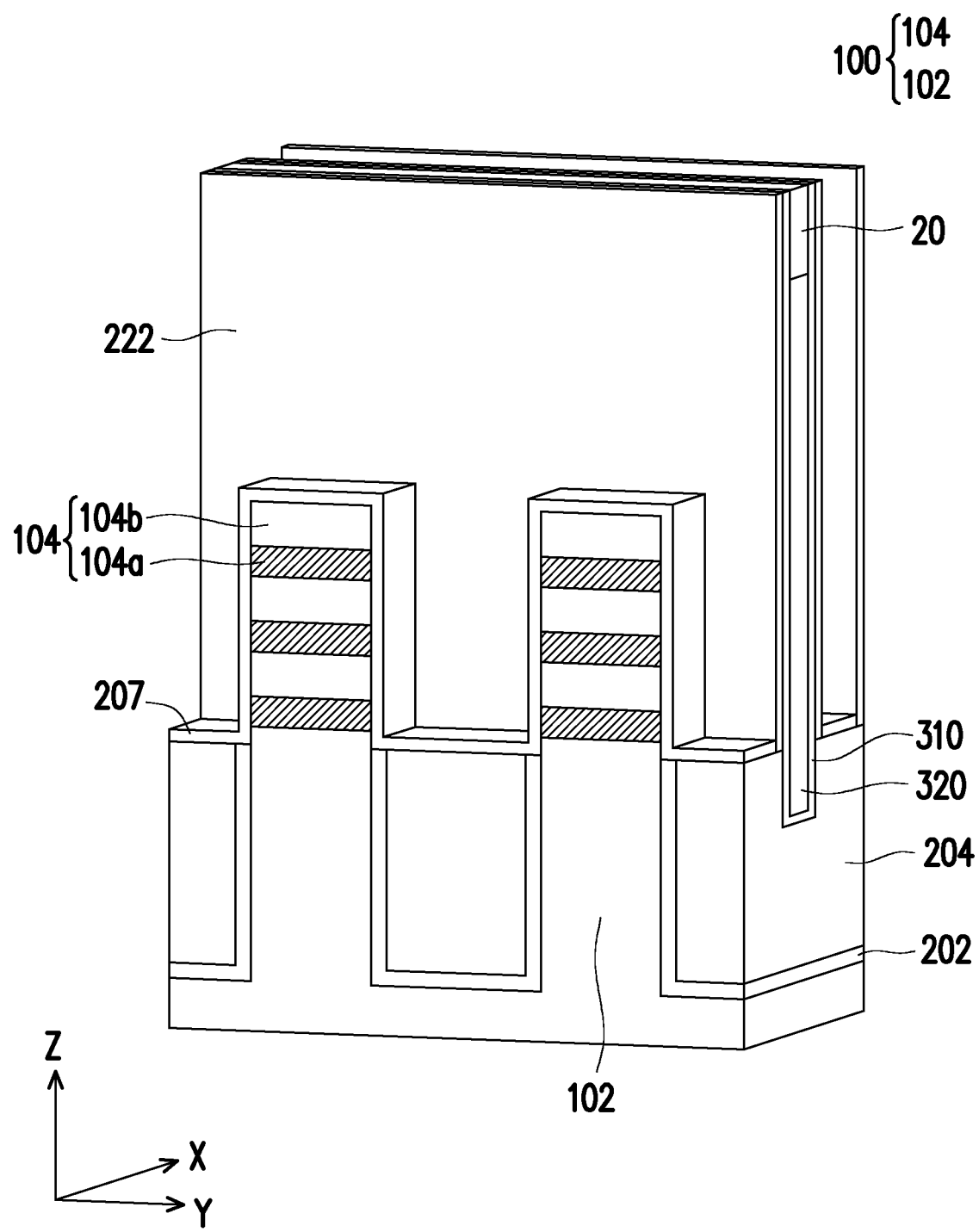

Referring to FIG. 18 and with reference to FIG. 17 and FIG. 16, the cladding layer 209 may then be removed after the removal of the dummy gates 212 to expose the dummy gate dielectrics 207. The cladding layer 209 may be removed from the nanostructures 104 by applying a selective etching process, while leaving the dummy gate dielectrics 207 substantially intact.

Figure 19:
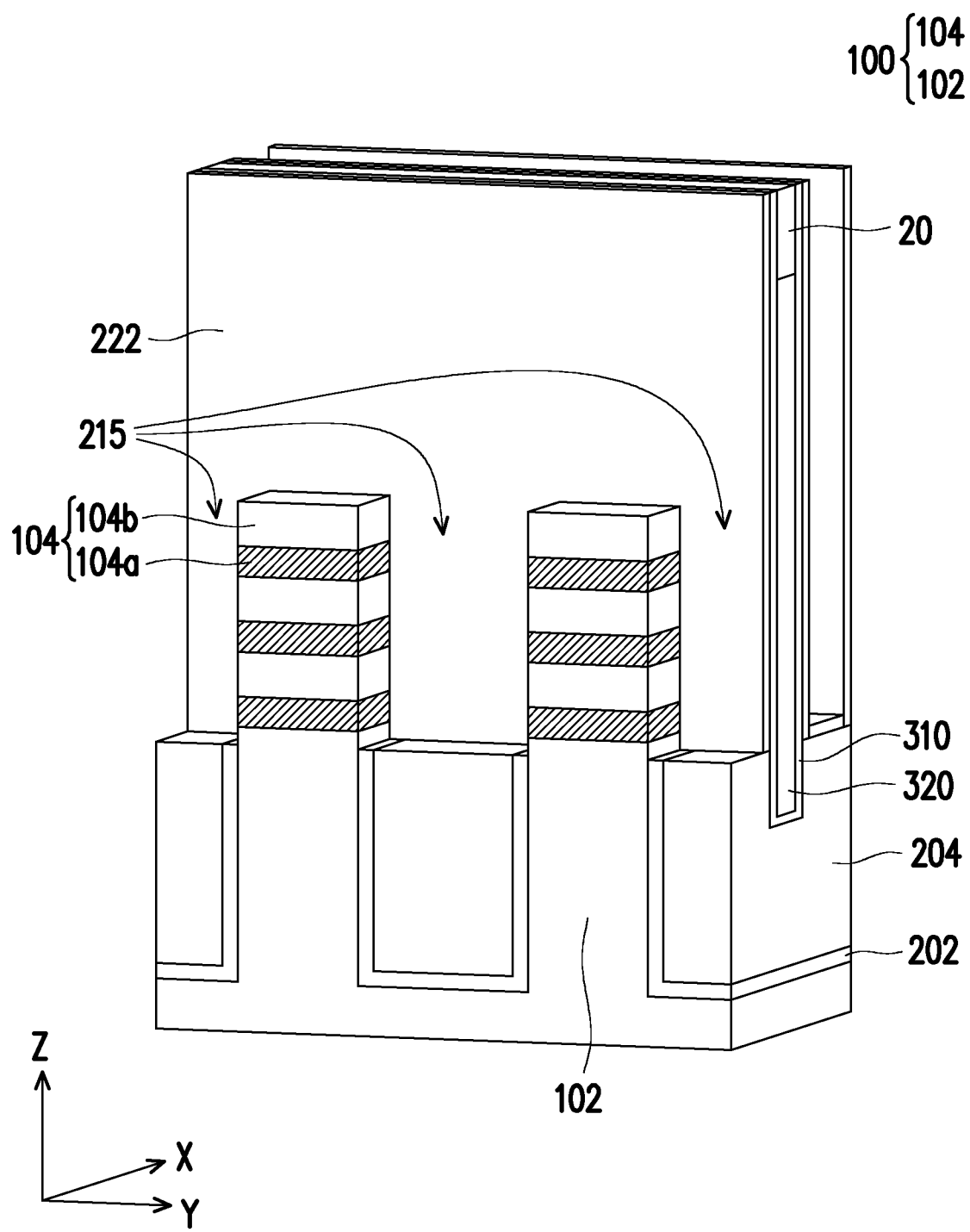

Referring to FIG. 19 and with reference to FIG. 18, the dummy gate dielectrics 207 may then be removed after the removal of the cladding layer 209 to expose the nanostructures 104. The dummy gate dielectrics 207 may be removed from the nanostructures 104 by applying a selective etching process, while leaving the nanostructures 104 substantially intact.

Figure 20:
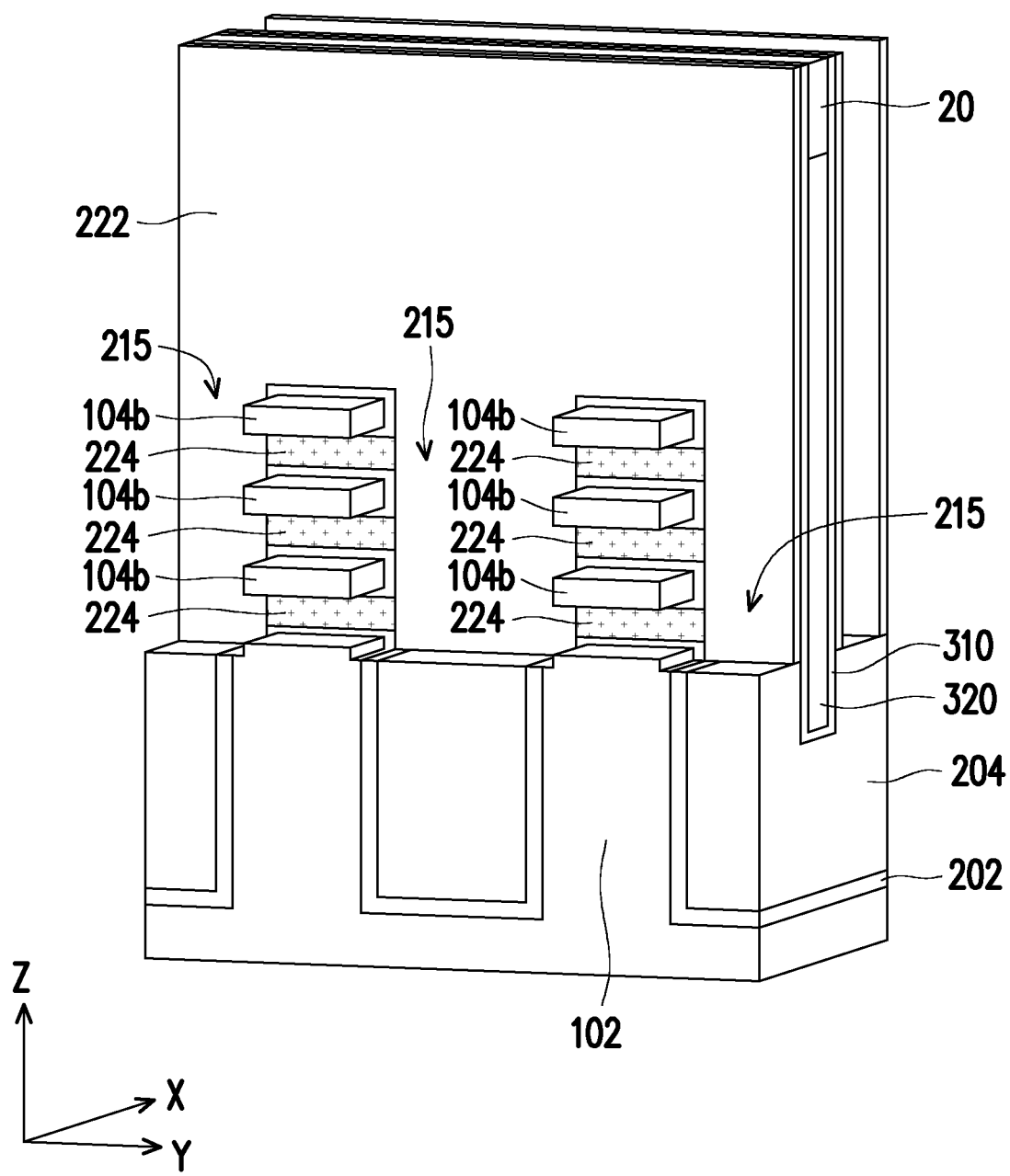

Referring to FIG. 20 and with reference to FIG. 19, the first semiconductor layers 104a are removed extending the recesses 215. The first semiconductor layers 104a may be removed by performing an isotropic etching process, such as wet etching or the like, using etchants which are selective to the materials of the first semiconductor layers 104a, while the second semiconductor layers 104b, the substrate 102, the shallow trench isolation structure 204, the gate spacers 222, and the inner spacers 224 remain relatively un-etched as compared to the first semiconductor layers 104a. Namely, the first semiconductor layers 104a may be removed by applying a selective etching process, while leaving the second semiconductor layers 104b substantially intact. As shown in FIG. 20, the inner spacers 224 remain under the gate spacers 222. In embodiments in which the second semiconductor layers 104b include, e.g., Si or SiC, and the first semiconductor layers 104a include, e.g., SiGe, tetramethylammonium hydroxide (TMAH), ammonium hydroxide ($NH_4OH$), or the like may be used to remove the first semiconductor layers 104a.

Figure 21:
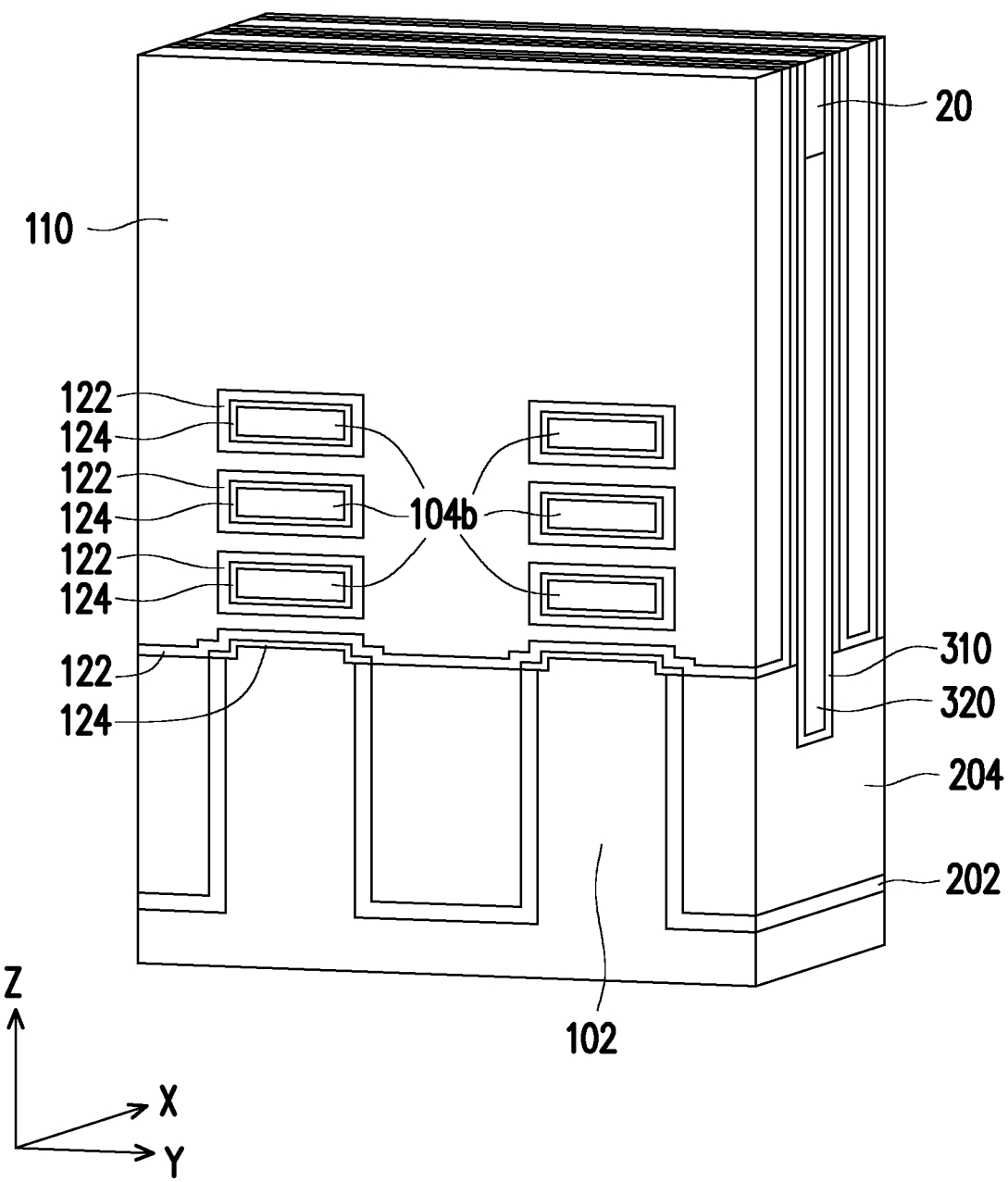

Referring to FIG. 21 and with reference to FIG. 20, after releasing the second semiconductor layers 104b, a gate dielectric layer 122 and a gate metal layer 110 are formed for replacement gates. The gate dielectric layer 122 is deposited conformally in the recesses 215 and covered the shallow trench isolation structure 204. The respective gate structure includes the gate dielectric layer 122 wrapping around each second semiconductor layer 104b, and the gate metal layer 110 wrapping around each second semiconductor layer 104b with the gate dielectric layer 122 disposed therebetween, where the second semiconductor layers 104b (sometimes referred to as semiconductor nano-wires) function as channel regions. The gate dielectric layer 122 may be a single high-k dielectric material having a k-value greater than about 7, or may include a stack of multiple high-k dielectric materials. In some embodiments, the gate dielectric layer 122 may include a metal oxide or a silicate of hafnium, aluminum, zirconium, lanthanum, manganese, barium, titanium, lead, and combinations thereof. The formation methods of the gate dielectric layer 122 may include molecular-beam deposition (MBD), ALD, PECVD, or the like. Other suitable dielectric material(s) may be used to form the gate dielectric layer 122. In some embodiments, an interfacial layer 124 is formed between each second semiconductor layer 104b and the gate dielectric layer 122.

The gate metal layer 110 may include a number of sections abutted to each other along the Z-direction, each of the gate metal sections may extend not only along a horizontal plane (e.g., the X-Y plane), but also along a vertical direction (e.g., the Z-direction), and thus two adjacent ones of the gate metal sections may adjoin together to wrap around a corresponding one of the second semiconductor layers 104b, with the gate dielectric layer 122 disposed therebetween. The gate metal layer 110 is deposited over the gate dielectric layers 122 and fill remaining portions of the recesses 215. The gate metal layer 110 may include a metal-containing material such as titanium nitride, titanium oxide, tantalum nitride, tantalum carbide, cobalt, ruthenium, aluminum, tungsten, combinations thereof, or multi-layers thereof. For example, although single-layer gate metal layer 110 are illustrated in FIG. 21, the gate metal layer 110 may comprise any number of liner layers, any number of work function tuning layers, and a fill material. Any combination of the layers that make up the gate metal layer 110 may be deposited between adjacent ones of the second semiconductor layers 104b.

Figure 22A:
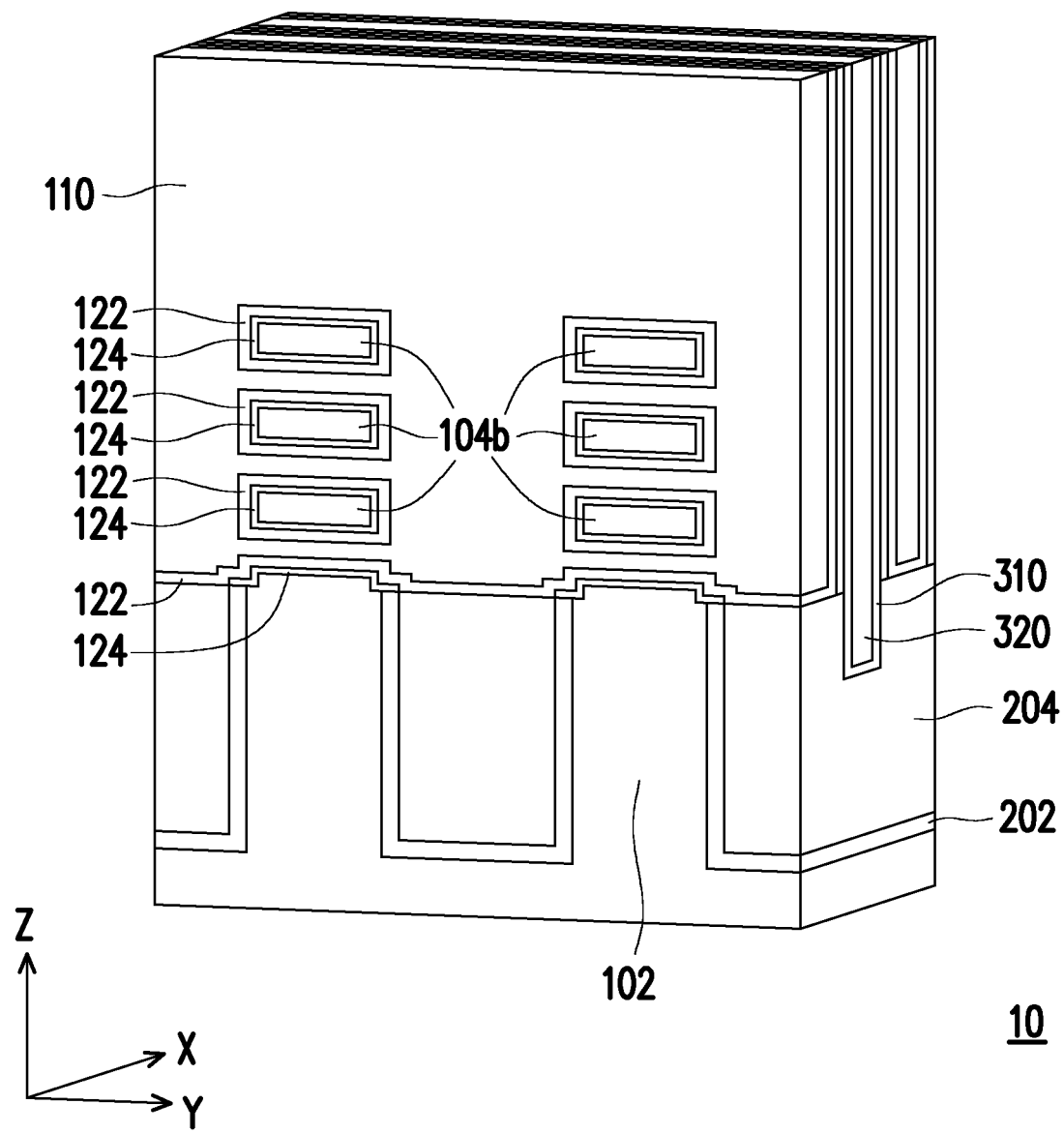
Figure 22B:
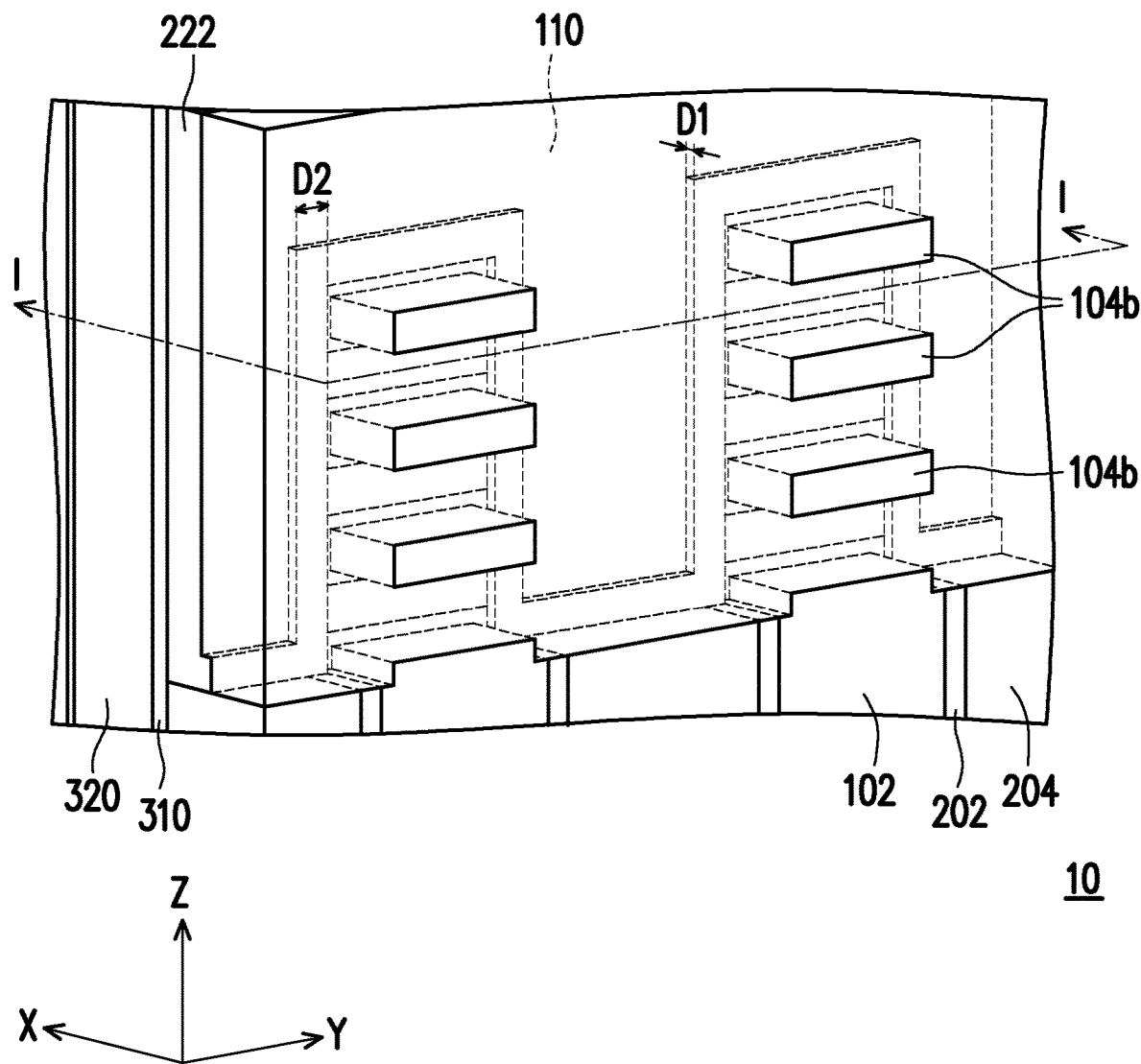
FIG. 22B is another perspective views schematically illustrating various stages of the manufacturing method of the semiconductor device, where FIG. 22B corresponds to FIG. 22A, in accordance with some embodiments.
Figure 22C:
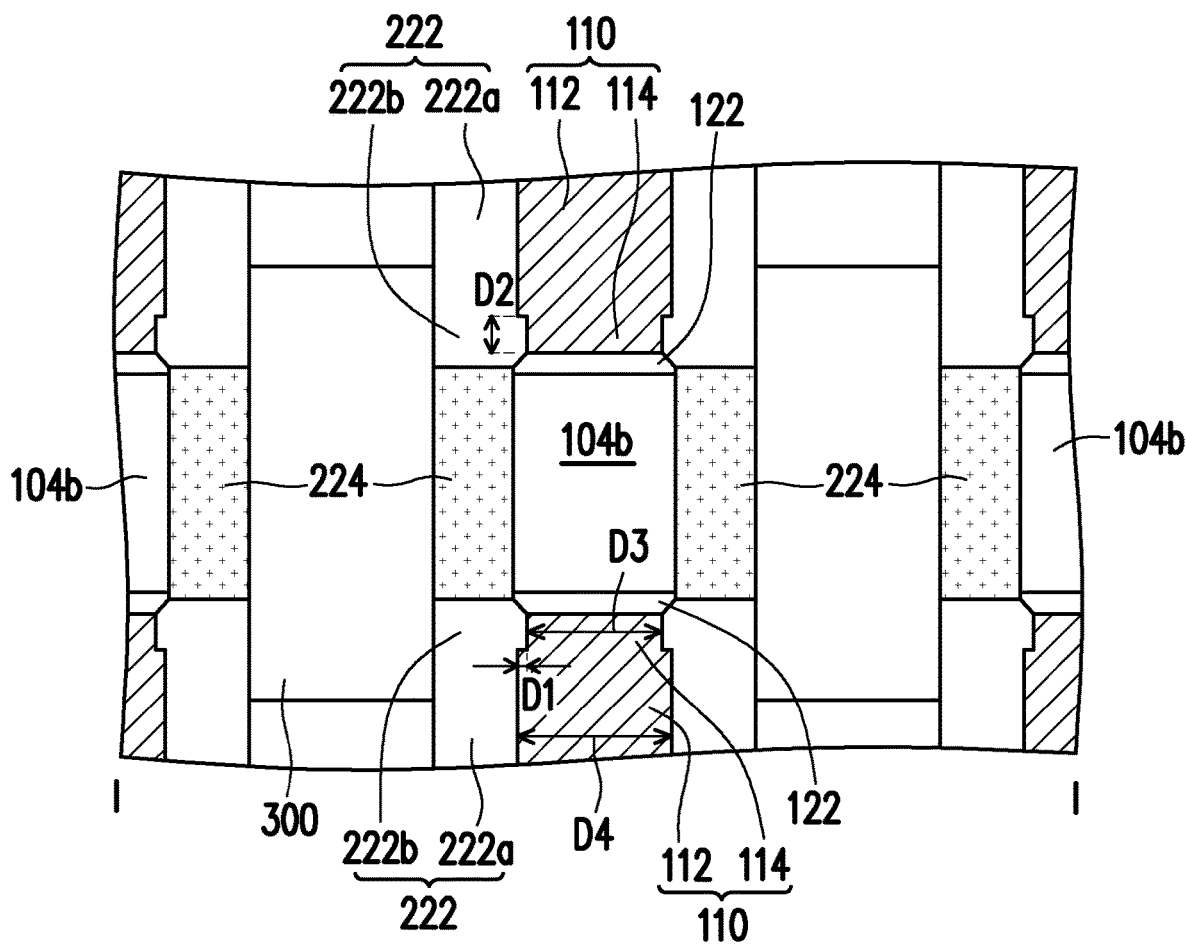
FIG. 22C is cross-sectional views of the semiconductor device along line I-I of FIG. 22B, where FIG. 22C corresponds to FIGS. 22B, in accordance with some embodiments.

Referring to FIG. 22A and with reference to FIG. 21, after sequentially depositing the materials of the gate structure, the excess portions (i.e. upper portion) of the material of the gate metal layer 110 may be removed by a planarizing process, e.g., a CMP process, and a semiconductor device 10 is completed.

Referring to FIG. 22A, FIG. 22B and FIG. 22C simultaneously, it should be noted that FIG. 22B illustrates a portion in FIG. 22A for clarity of illustration, and thus some layers/structures are not shown in this perspective view. FIG. 22C is cross-sectional views of the semiconductor device along line I-I of FIG. 22B, where FIG. 22C corresponds to FIGS. 22B, in accordance with some embodiments. From a cross-section view, the gate metal layer 110 includes a main portion 112 and a neck portion 114, and the neck portion 114 of the gate metal layer 110 adjacent to and along the second semiconductor layers 104b, and one side of the neck portion 114 is retracted by a distance D1 relative to the gate spacer 222, and the distance D1 is, for example, greater than 0 and less than or equal to 2 nanometers. The neck portion 114 of the gate metal layer 110 contacts the gate dielectric layer 122. A thickness D2 of the neck portion 114 of the gate metal layer 110 is, for example, greater than 0 and less than 10 nanometers. The main portion 112 of the gate metal layer 110 from the cross-section view has no corner footing and extends vertically to the neck portion 114. A length difference exists between a length D4 of the main portion 112 and a length D3 of the neck portion 114, and the length difference is, for example, greater than 0 and less than or equal to 4 nanometers.

On the other hand, the gate spacer 222 is in contact with a sidewall of the gate metal layer 110 and includes a first portion 222a and a second portion 222b. The main portion 112 and the neck portion 114 of the gate metal layer 110 are corresponding to the first portion 222a and the second portion 222b of the gate spacer 222, respectively. The first portion 222a of the gate spacer 222 from the cross-section view has no corner footing and extends vertically to the second portion 224a. The second portion 222b is located between the first portion 222a and the second semiconductor layers 104b, and adjacent to and along second semiconductor layers 104b. The second portion 222b protrudes the distance D1 relative to the first portion 222a. The second portion 222b of the gate spacer 222 contacts the gate dielectric layer 122. The thickness of the second portion 222b of the gate spacer 222 is, for example, greater than 0 and less than 10 nanometers. Since the gate spacer 222 can be the low-k spacer, and second portion 222b adjacent to the second semiconductor layers 104b is thicker than the first portion 222a, that is, the distance from the gate metal layer 110 to the epitaxial structures 300 is longer, so as to improve the electrical performance (e.g. device AC improve −2%~+5%) and power efficacy (e.g. 2%~5% improvement). The second portion 222b of the gate spacer 222 with low-k is thicker than the first portion 222a, which can reduce the capacitance value between the gate metal layer 110 and the epitaxial structures 300, so as to reduce RC delay and improve the performance of the AC circuit. In short, the device AC improve, for example, −2~5% with thicker low-K spacer (e.g. the gate spacer 222) along nano sheet and the short channel control with gate around nanosheet is not impact. Therefore, the special profile of the gate metal layer 110 can improve the yield, reliability and electrical performance of the semiconductor device 10.

According to some embodiments, a semiconductor device including a substrate, a shallow trench isolation structure, two epitaxial structures, one or more semiconductor channel layers, a gate metal layer and a gate spacer is provided. The shallow trench isolation structure is disposed over the substrate. The epitaxial structures are disposed over the shallow trench isolation structure. The one or more semiconductor channel layers connect the two epitaxial structures. The gate metal layer is located between the epitaxial structures and engages the one or more semiconductor channel layers. The gate spacer is in contact with a sidewall of the gate metal layer. From a cross-section view, a neck portion of the gate metal layer adjacent to and along the one or more semiconductor channel layers, and one side of the neck portion is retracted by a distance relative to the gate spacer, and the distance is greater than 0 and less than or equal to 2 nanometers.

According to some alternative embodiments, a semiconductor device including a substrate, a shallow trench isolation structure, two epitaxial structures, one or more semiconductor channel layers, a gate metal layer and a gate spacer is provided. The shallow trench isolation structure is disposed over the substrate. The epitaxial structures are disposed over the shallow trench isolation structure. The one or more semiconductor channel layers connect the two epitaxial structures. The gate metal layer is located between the two epitaxial structures and engages the one or more semiconductor channel layers. The gate spacer is in contact with a sidewall of the gate metal layer and includes a first portion and a second portion. From a cross-section view, the second portion is located between the first portion and the one or more semiconductor channel layers, and adjacent to and along the one or more semiconductor channel layers. The second portion protrudes a distance relative to the first portion, and the distance is greater than 0 and less than or equal to 2 nanometers.

According to some alternative embodiments, a manufacturing method of a semiconductor device includes forming a fin structure by a patterned mask layer, wherein the fin structure comprises a substrate and nanostructures formed on the substrate, the nanostructures comprise one or more semiconductor channel layers and one or more semiconductor sacrificial layers alternately stacked; forming a shallow trench isolation structure on the substrate of the fin structure; forming a dummy dielectric layer extending along sidewalls of nanostructures of the fin structure; forming a cladding layer conformally on the dummy dielectric layer; forming a dummy gate layer on the cladding layer; removing a portion of the dummy gate layer by performing an etching process, wherein the portion of the dummy gate layer is removed to form a dummy gate, and an etch rate of the cladding layer is higher than an etch rate of the dummy gate layer, so that edges of the cladding layer and edges of the dummy gate layer are retracted by a distance relative to edges of the dummy gate; forming a gate spacer on the nanostructures of the fin structure, the dummy gate, the cladding layer and the dummy dielectric layer; forming two epitaxial structures coupled to the fin structure; and removing the cladding layer and the dummy dielectric layer before forming a gate metal layer engaging the one or more semiconductor channel layers and located between the two epitaxial structures, wherein from a cross-section view, a neck portion of the gate metal layer adjacent to and along the one or more semiconductor channel layers, and one side of the neck portion is retracted by the distance relative to the gate spacer, and the distance is greater than 0 and less than or equal to 2 nanometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a shallow trench isolation structure disposed over the substrate;
    two epitaxial structures disposed over the shallow trench isolation structure;
    one or more semiconductor channel layers connecting the two epitaxial structures;
    a gate metal layer located between the two epitaxial structures and engaging the one or more semiconductor channel layers; and
    a gate spacer in contact with a sidewall of the gate metal layer, wherein from a cross-section view, a neck portion of the gate metal layer adjacent to and along the one or more semiconductor channel layers, and one side of the neck portion is retracted by a distance relative to the gate spacer, and the distance is greater than 0 and less than or equal to 2 nanometers.

2. The semiconductor device as claimed in claim 1, further comprising:
    a gate dielectric layer wrapping around the one or more semiconductor channel layers, wherein the neck portion of the gate metal layer contacts the gate dielectric layer.

3. The semiconductor device as claimed in claim 1, wherein from the cross-section view, a thickness of the neck portion of the gate metal layer is greater than 0 and less than 10 nanometers.

4. The semiconductor device as claimed in claim 1, wherein a material of the gate spacer comprises silicon nitride, silicon nitricarbide, silicon oxycarbonitride, silicon oxycarbide or Silicon oxynitride.

5. The semiconductor device as claimed in claim 1, wherein a main portion of the gate metal layer from the cross-section view has no corner footing and extends vertically to the neck portion.

6. The semiconductor device as claimed in claim 5, wherein from the cross-section view, a length difference exists between the main portion and the neck portion, and the length difference is greater than 0 and less than or equal to 4 nanometers.

7. A semiconductor device, comprising:
   a substrate;
   a shallow trench isolation structure disposed over the substrate;
   two epitaxial structures disposed over the shallow trench isolation structure;
   one or more semiconductor channel layers connecting the two epitaxial structures;
   a gate metal layer located between the two epitaxial structures and engaging the one or more semiconductor channel layers; and
   a gate spacer in contact with a sidewall of the gate metal layer and comprising a first portion and a second portion, wherein from a cross-section view, the second portion is located between the first portion and the one or more semiconductor channel layers, and adjacent to and along the one or more semiconductor channel layers, the second portion protrudes a distance relative to the first portion, and the distance is greater than 0 and less than or equal to 2 nanometers.

8. The semiconductor device as claimed in claim 7, further comprising:
   a gate dielectric layer wrapping around the one or more semiconductor channel layers, wherein the second portion of the gate spacer contacts the gate dielectric layer.

9. The semiconductor device as claimed in claim 7, wherein from the cross-section view, a thickness of the second portion of the gate spacer is greater than 0 and less than 10 nanometers.

10. The semiconductor device as claimed in claim 7, wherein a material of the gate spacer comprises silicon nitride, silicon nitricarbide, silicon oxycarbonitride, silicon oxycarbide or Silicon oxynitride.

11. The semiconductor device as claimed in claim 7, wherein the first portion of the gate spacer from the cross-section view has no corner footing and extends vertically to the second portion.

12. The semiconductor device as claimed in claim 7, wherein from the cross-section view, the gate metal layer comprises a main portion and a neck portion corresponding to the first portion and the second portion of the gate spacer, respectively.

13. The semiconductor device as claimed in claim 12, wherein from the cross-section view, a length difference exists between the main portion and the neck portion, and the length difference is greater than 0 and less than or equal to 4 nanometers.

14. A semiconductor device, comprising:
   a substrate;
   a shallow trench isolation structure disposed over the substrate;
   two epitaxial structures disposed over the shallow trench isolation structure;
   one or more semiconductor channel layers connecting the two epitaxial structures;
   a gate metal layer located between the two epitaxial structures and engaging the one or more semiconductor channel layers, wherein the gate metal layer comprises a main portion and a neck portion, from a cross-section view, a length difference exists between the main portion and the neck portion, and one side of the neck portion is retracted by a distance relative to one side of the main portion, and the distance is greater than 0 and less than or equal to 2 nanometers; and
   a gate spacer in contact with a sidewall of the gate metal layer.

15. The semiconductor device as claimed in claim 14, further comprising:
   a gate dielectric layer wrapping around the one or more semiconductor channel layers, wherein the neck portion of the gate metal layer contacts the gate dielectric layer.

16. The semiconductor device as claimed in claim 14, wherein from the cross-section view, a thickness of the neck portion of the gate metal layer is greater than 0 and less than 10 nanometers.

17. The semiconductor device as claimed in claim 14, a material of the gate spacer comprises silicon nitride, silicon nitricarbide, silicon oxycarbonitride, silicon oxycarbide or Silicon oxynitride.

18. The semiconductor device as claimed in claim 14, wherein the gate spacer layer has a k-value less than or equal to 7.

19. The semiconductor device as claimed in claim 14, wherein the main portion of the gate metal layer from the cross-section view has no corner footing and extends vertically to the neck portion.

20. The semiconductor device as claimed in claim 14, wherein the length difference is greater than 0 and less than or equal to 4 nanometers.

* * * * *